United States Patent
Lostoski et al.

(10) Patent No.: US 9,119,295 B2
(45) Date of Patent: Aug. 25, 2015

(54) DISPLAY MOUNTING TECHNIQUES

(75) Inventors: Douglas A. Lostoski, Richfield, OH (US); Geoff M. Sieron, Willoughby Hills, OH (US); Andrew P. Kaufman, Milwaukee, WI (US); William M. Ruddy, Chardon, OH (US); Daniel L. Stefaniak, Franklin, WI (US); Douglas R. Bodmann, Shaker Heights, OH (US); Gary Dan Dotson, Muskego, WI (US); Mark S. Williams, Waukesha, WI (US); Senthil P. Kumar, Kolathur Chennai (IN)

(73) Assignee: ROCKWELL AUTOMATION TECHNOLOGIES, INC., Mayfield Heights, OH (US)

( * ) Notice: Subject to any disclaimer, the term of this patent is extended or adjusted under 35 U.S.C. 154(b) by 939 days.

(21) Appl. No.: 13/270,359

(22) Filed: Oct. 11, 2011

(65) Prior Publication Data

US 2013/0087665 A1    Apr. 11, 2013

(51) Int. Cl.
*H04N 5/64* (2006.01)
*H05K 5/02* (2006.01)
*H05K 5/00* (2006.01)
*H05K 7/14* (2006.01)

(52) U.S. Cl.
CPC ............... *H05K 5/02* (2013.01); *H05K 5/0017* (2013.01); *H05K 5/0204* (2013.01); *H05K 7/1481* (2013.01); *Y10T 29/49826* (2015.01)

(58) Field of Classification Search
None
See application file for complete search history.

(56) References Cited

U.S. PATENT DOCUMENTS

| | | | |
|---|---|---|---|
| 6,128,183 A | 10/2000 | Uchiyama et al. | |
| 7,310,222 B2 | 12/2007 | Bovio et al. | |
| 2001/0038523 A1* | 11/2001 | Bang | 361/681 |
| 2002/0067591 A1* | 6/2002 | Tajima | 361/681 |
| 2003/0112379 A1* | 6/2003 | Jung | 348/789 |
| 2007/0091226 A1* | 4/2007 | Yamanaka | 349/60 |

(Continued)

FOREIGN PATENT DOCUMENTS

| | | |
|---|---|---|
| CN | 1300162 A | 6/2001 |
| TW | 201023645 A | 6/2010 |

OTHER PUBLICATIONS

EXTER K60/K60m/K60c Installation Manual. © Beijer Electronics AB, MAEN811C, Aug. 2009, 28 pages.

(Continued)

*Primary Examiner* — Jay Patel
*Assistant Examiner* — Francis G Geroleo
(74) *Attorney, Agent, or Firm* — Amin, Turocy & Watson, LLP

(57) ABSTRACT

The disclosed subject matter comprises a display retention bracket (DRB) that can be attached to, and can retain and horizontally mount, a display using display retention components, without using fasteners, for insertion of the display in a bezel that does not support horizontal mounting; and includes: a cable retention component that enables the cable to withstand a specified pull-out force to maintain connection of the cable to the display; a cable guide to maintain cable wires in a desired position in relation to other components; alignment pins to align the DRB and display with a bezel housing; non-symmetrical tabs to ensure the display is oriented correctly; offset columns that desirably offset loads on the display when an adapter plate is applied onto the DRB and display, and fastened to the bezel to secure the display; and a ground clip to extend the ground path from the bezel to the display.

15 Claims, 26 Drawing Sheets

(56) References Cited

U.S. PATENT DOCUMENTS

| | | | |
|---|---|---|---|
| 2007/0115619 A1* | 5/2007 | Wang et al. | 361/679 |
| 2007/0263347 A1* | 11/2007 | Hong et al. | 361/681 |
| 2010/0141863 A1* | 6/2010 | Chang | 349/58 |
| 2012/0026658 A1* | 2/2012 | Yoshimatsu et al. | 361/679.01 |
| 2012/0033364 A1* | 2/2012 | Nonaka | 361/679.01 |
| 2012/0170185 A1* | 7/2012 | Lin | 361/679.01 |

OTHER PUBLICATIONS

EXTER T70sr Installation Manual. © Beijer Electronics AB, MAEN964, Nov. 2008, 26 pages.

EXTER—series Operator Terminals Service and Maintenance Manual. © Beijer Electronics AB, MA00757A, Jul. 2006, 54 pages.

Chinese Office Action Report for Chinese Patent Application No. 201210384489.8 dated Jan. 4, 2015.

\* cited by examiner

DISPLAY MOUNTING TECHNIQUES

TECHNICAL STATEMENT

The subject disclosure relates to automation control, and more specifically, to display mounting techniques for a display associated with an industrial control system.

BACKGROUND

Industrial control systems can be employed to regulate operation of equipment in an industrial environment, where operation of the equipment can include process(es) typically directed to accomplishment of a complex task or a streamlined, automated task, such as large scale manufacturing. Regulation of operation of the equipment and related process(es) typically exploits and produces substantive amounts of control data, which include configuration data such as controller code, human-machine interface (HMI) data, process recipe(s) and report definitions, or the like. In addition, operation of industrial control systems also produces both real-time and historical data about the status of regulated equipment and related process(es), the data including alarms, process values, and audit/error logs. To operate industrial control systems, various HMIs in the industrial environment render control data (real-time (or last known) and historical data) through operator interfaces which convey process overviews or equipment detail. Information relating to the operation of the industrial control system and at least some of the various types of interfaces are often presented to the operator via one or more displays.

One particular display associated with a particular industrial control system is traditionally mounted using screws, such as micro screws, which are inserted in a horizontal direction into the sides of the display housing. However, the particular bezel design does not allow for horizontal mounting, and only allows vertical mounting of the display. As a result, it is necessary to retain the display in the vertical direction in accordance with the bezel design, yet the display still has to be retained horizontally for alignment purposes.

Another issue with regard to that particular display is that there are a significant number of cables associated with the display, and it is desirable to maintain the positioning of these cables so that the cables are not degraded or corrupted (e.g., pinched, shorted, broken, etc.) by other components associated with the display. Still another issue with regard to that particular display is that, in accordance with industrial standards, it is necessary for the cable connector associated with the cable wires to be able to withstand at least 15 Newtons (N) of pulling out force such that the cable connector will not be disengaged from the socket on the display unless more than 15 N of force is applied to pull out the cable connector from its connection counterpart.

Yet another issue relating to that particular display is that a dust gasket, which is to be positioned below the display, has to be in compression for the display and associated dust gasket to perform properly. In this regard, another issue is that an undesired amount and/or distribution of force (e.g., sub-optimal amount of force and/or uneven distribution of force) on the display can result in impaired operation of the display.

Another issue is that the display should be properly grounded in relation to the bezel housing. With the display itself not being able to be horizontally mounted in the bezel housing, the insertion of the display in the bezel housing may result in the display not having a conductive ground path with the bezel. If the display does not have a conductive ground path with the bezel, the display may not be properly grounded, which could negatively impact performance of the display.

The above-described deficiencies of today's devices and systems are merely intended to provide an overview of some of the problems of conventional devices and systems, and are not intended to be exhaustive. Other problems with the state of the art and corresponding benefits of some of the various non-limiting embodiments may become further apparent upon review of the following detailed description.

SUMMARY

The following presents a simplified summary in order to provide a basic understanding of some aspects of the subject disclosure. This summary is not an extensive overview, and it is not intended to identify key/critical elements of the subject disclosure or to delineate any scope. The sole purpose of this summary is to present some concepts in a simplified form as a prelude to the more detailed description that is presented later.

The disclosed subject matter comprises a display retention bracket (DRB) that can be attached to and can retain a display using a plurality of display retention components (DRCs) in a horizontal direction to horizontally mount the display without having to use fasteners to facilitate mounting the display in a bezel housing that supports vertical mounting of the display but does not support horizontal mounting, wherein the DRB (with the display retained therein via horizontal mount) can be inserted into and vertically mounted in the bezel housing, as more fully disclosed herein. In another aspect, the DRB also can include a cable retention component that can enable a cable connector, associated with (e.g., connected to) one or more cable wires, to withstand at least a specified amount of pull-out force to maintain connection of the cable connector to a cable receptacle on the back side of the display. In still another aspect, the DRB can include a cable guide that can be employed to maintain one or more cable wires of a cable in a desired position in relation to other components, wherein the one or more cable wires can be routed via, and secured within, one or more channels formed in the cable guide to restrict movement of the cable wires and maintain the one or more cable wires in a desired position in relation to other components associated with the display.

In yet another aspect, the DRB can contain a specified number of alignment pins, which can be utilized to precisely align the DRB and display with a bezel housing when the DRB and display are placed in or on the bezel housing. For instance, the alignment pins can be formed on the DRB in respective positions that can correspond to respective holes in the bezel housing, wherein the respective pins can be inserted in the respective holes to place the DRB and display within the bezel housing with the desired alignment. In accordance with still another aspect, the DRB can comprise a specified number (e.g., 2) of non-symmetrical tabs that can be employed to ensure the display is oriented correctly, wherein the specified number of non-symmetrical tabs can, for example, restrict the placement of the DRB and display in the bezel housing by an assembly system or an assembler such that the orientation of the DRB and display within the bezel housing results in the proper display of information when the display is powered on (e.g., display will have a right-side-up orientation).

In yet another aspect, the DRB can include a plurality of offset columns that can desirably offset loads on the display when an adapter plate is applied onto the DRB and display, and fastened to the bezel to secure the display, while also enabling the fastening of the adapter plate to the bezel to desirably secure the display within the bezel housing. The offset columns can extend vertically upward from the main frame of the DRB and away from the bezel toward the adapter plate, wherein the offset columns can facilitate providing a desired amount of clamping force to the display and a dust gasket associated with the display. In another aspect, the offset columns can be offset by a specified amount from their corresponding supports on the bottom of the DRB to act or function as a compliant or deflection member for the bezel housing. In still another aspect, the DRB also can comprise a ground clip that can extend the ground path from the bezel to the display to adequately ground the display. For instance, the ground clip can be positioned so that it is in contact with the bezel when the DRB and display are placed within the bezel housing, and the ground clip also can be in contact with the housing (e.g., metal housing) of the display.

In accordance with various aspects, the disclosed subject matter can comprise a DRB that includes a main frame configured to have a perimeter that has a shape and a size that is proportional to a housing of a display to enable a portion of the housing of the display to be inserted into a space defined and surrounded by the main frame, wherein the portion of the housing of the display has a defined shape and size. The DRB also can include a plurality of DRCs that are formed on a surface of the main frame in locations that correspond to locations of a plurality of holes in the housing of the display, wherein the plurality of DRCs are configured to be slidable into the plurality of holes to retain the display, without using screws, to mount the display when the display and the DRB are inserted into a housing of a bezel.

In accordance with various other aspects, the disclosed subject matter can include a method comprising the act of forming a main frame of a DRB, wherein the main frame has a substantially polygonal shape and a specified size, wherein the main frame is large enough to contain at least a portion of a display within an area defined and surrounded by the main frame, and wherein the portion of the display has a defined size and shape. The method also includes the act of forming a specified number of display retention components on an inner surface of the main frame of the display retention bracket to facilitate retaining the display in a horizontal direction to horizontally mount the display, without using screws, when the display retention bracket is attached to the display and the display retention bracket and the display are inserted into and vertically mounted to a housing of a bezel that is structured to not allow horizontal mounting of the display.

In accordance with still other aspects, the disclosed subject matter can comprise a system comprising one or more DRBs, wherein a DRB of the one or more DRBs comprises: a main frame configured to hold a display having a housing that has a convex quadrilateral shape and a specified size, without using screws, to mount the display when the display and the one or more DRBs are inserted into a bezel housing.

To the accomplishment of the foregoing and related ends, certain illustrative aspects of the disclosed subject matter are described herein in connection with the following description and the annexed drawings. These aspects are indicative, however, of but a few of the various ways in which the principles disclosed herein can be employed and is intended to include all such aspects and their equivalents. Other advantages and novel features will become apparent from the following detailed description when considered in conjunction with the drawings.

DETAILED DESCRIPTION

Figure 1:
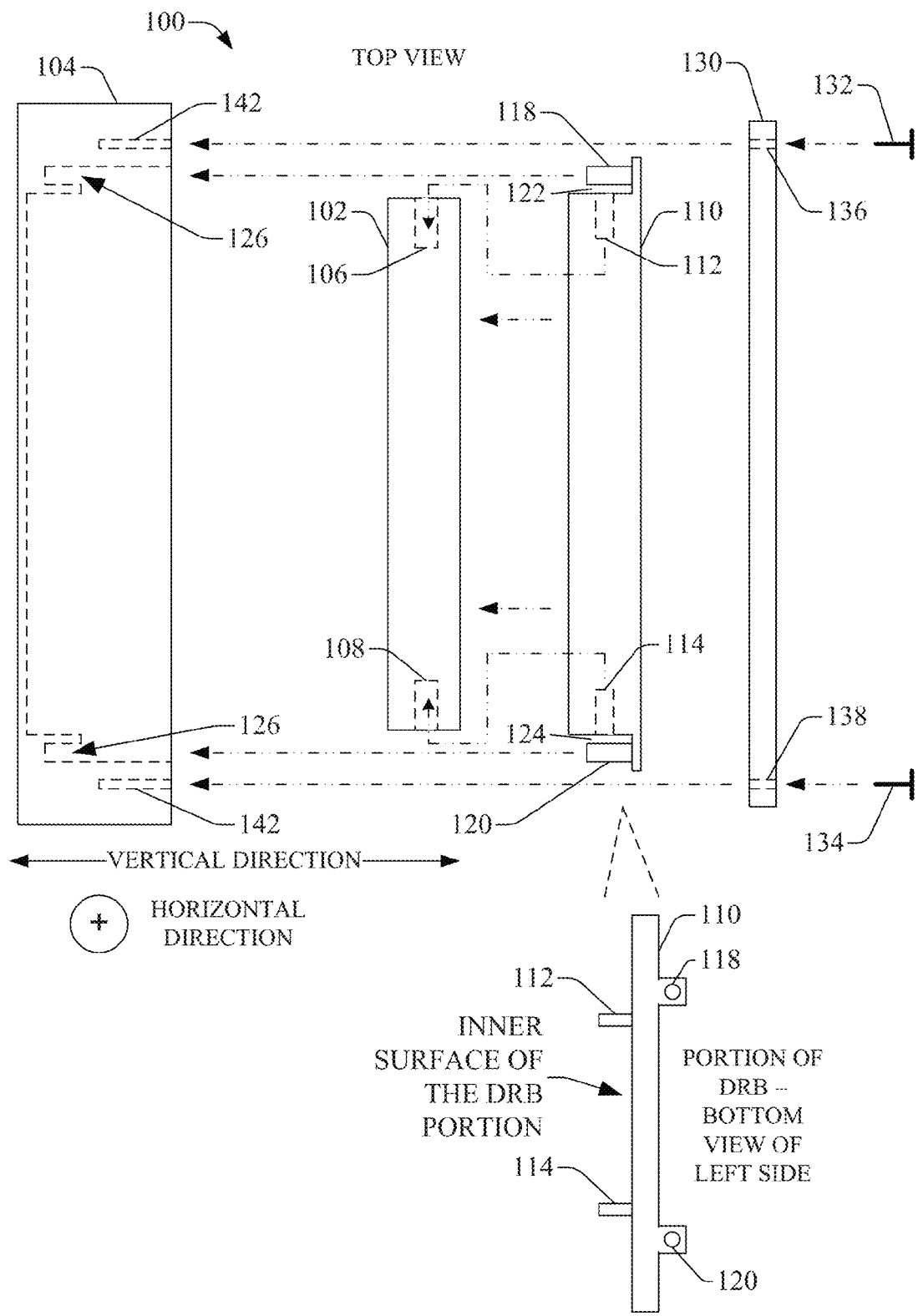
FIG. 1 illustrates a block diagram of an example system that can secure a display associated with an industrial control system in accordance with various aspects and embodiments.

The subject disclosure is now described with reference to the drawings, wherein like reference numerals are used to refer to like elements throughout. In the following description, for purposes of explanation, numerous specific details are set forth in order to provide a thorough understanding thereof. It may be evident, however, that the subject disclosure can be practiced without these specific details. In other instances, well-known structures and devices are shown in block diagram form in order to facilitate a description thereof.

As used in this application, in certain instances, the terms "component," "system," and the like, can refer to a mechanical or physical entity; and, in certain other instances, the terms "component", "system", "platform", "layer", "controller", "interface", and the like, can refer to a computer-related entity or an entity related to, or that is part of, an operational apparatus with one or more specific functionalities, wherein such entities can be either hardware, a combination of hardware and software, software, or software in execution. For example, a component can be, but is not limited to being, a process running on a processor, a processor, a hard disk drive, multiple storage drives (of optical or magnetic storage medium) including affixed (e.g., screwed or bolted) or removably affixed solid-state storage drives; an object; an executable; a thread of execution; a computer-executable program, and/or a computer. By way of illustration, both an application running on a server and the server can be a component. One or more components can reside within a process and/or thread of execution, and a component can be localized on one computer and/or distributed between two or more computers. Also, components as described herein can execute from various computer readable storage media having various data structures stored thereon. The components may communicate via local and/or remote processes such as in accordance with a signal having one or more data packets (e.g., data from one component interacting with another component in a local system, distributed system, and/or across a network such as the Internet with other systems via the signal). As another example, a component can be an apparatus with specific functionality provided by mechanical parts operated by electric or electronic circuitry which is operated by a software or a firmware application executed by a processor, wherein the processor can be internal or external to the apparatus and executes at least a part of the software or firmware application. As yet another example, a component can be an apparatus that provides specific functionality through electronic components without mechanical parts, the electronic components can include a processor therein to execute software or firmware that provides at least in part the functionality of the electronic components. As further yet another example, interface(s) can include input/output (I/O) components as well as associated processor, application, or Application Programming Interface (API) components. While the foregoing examples are directed to aspects of a component, the exemplified aspects or features also can apply to a system, platform, interface, layer, controller, and the like.

In addition, the term "or" is intended to mean an inclusive "or" rather than an exclusive "or." That is, unless specified otherwise, or clear from the context, the phrase "X employs A or B" is intended to mean any of the natural inclusive permutations. That is, the phrase "X employs A or B" is satisfied by any of the following instances: X employs A; X employs B; or X employs both A and B. In addition, the articles "a" and "an" as used in this application and the appended claims should generally be construed to mean "one or more" unless specified otherwise or clear from the context to be directed to a singular form.

Furthermore, the terms "set" or "subset" as employed herein exclude the empty set; e.g., the set with no elements therein. Thus, a "set" or a "subset" in the subject disclosure includes one or more elements or entities. As an illustration, a set of controllers includes one or more controllers; a set of data resources includes one or more data resources; etc. Likewise, the term "group" as utilized herein refers to a collection of one or more entities; e.g., a group of nodes refers to one or more nodes.

Various aspects or features will be presented in terms of systems that may include a number of devices, components, modules, and the like. It is to be understood and appreciated that the various systems may include additional devices, components, modules, etc. and/or may not include all of the devices, components, modules etc. discussed in connection with the figures. A combination of these approaches also can be used.

FIG. 1 illustrates a diagram of a side view of an example system 100 that can secure a display associated with an industrial control system in accordance with various aspects and embodiments. The system 100 can include a display 102 that can be employed to present information, such as information relating to the industrial control system. In an aspect, the display can be a liquid crystal display (LCD), light-emitting diode (LED) display, a combination LCD-LED display, a plasma display, etc. The display 102 can have a specified or defined size (e.g., 9 inches (e.g., diagonally for the display screen), 12 inches, 15 inches, or a smaller or larger size) and shape (e.g., polygonal, quadrilateral (e.g., convex quadrilateral), square, rectangular, circular, elliptical, etc.).

In another aspect, the system 100 can comprise a bezel 104 (also referred to herein as a bezel sub-assembly) that can be used to facilitate holding and securing the display 102, wherein the bezel 104 can be placed or attached in a desired location in an industrial control system so that the display 102 can be utilized by one or more users. Typically, the bezel 104 can have a shape and size that corresponds to the shape and size of the display, but with the size being larger than the size of the display 102 by a specified amount so that the display 102 can be placed wholly or at least partially within the bezel 104. It is to be appreciated and understood though that, in accordance with other embodiments, the display 102 can be differently shaped than the bezel 104 and/or can be sized such that the display 102 is significantly smaller than the bezel 104.

The display 102 can comprise a plurality of holes (e.g., screw holes), such as holes 106 and 108, on the one side of the display 102 and corresponding holes (not shown in FIG. 1) on the other side of the display 102, wherein conventionally relatively small screws (e.g., M2 screws or micro screws) are inserted horizontally into the holes 106 and 108 of the display 102. However, the bezel 104 is structured such that the bezel 104 does not allow for horizontal mounting of the display 102, but does allow vertical mounting. As a result, the display 102 has to be retained in the vertical direction in relation to the bezel 104, but also has to be retained horizontally for alignment purposes. Further, during assembly, it can be difficult to insert the relatively small screws into the holes 106 and 108 when attempting to secure the display 102 in the bezel 104 and retain the display 102 horizontally.

In accordance with various aspects and embodiments, the system 100 can include a display retention bracket (DRB) 110 that can be used to retain the display 102 in the horizontal direction to mount the display 102 horizontally, while also enabling the display 102 to be secured or retained in the vertical direction within the bezel 104. In an aspect, the DRB 110 can retain the display 102 in the horizontal direction without having to use fasteners (e.g., screws, such as micro screws), which thereby overcomes the difficulty involved in trying to insert the fasteners. In an embodiment, the DRB 110 can be formed of a compliant material or geometry (e.g., plastic, rubberized plastic compound, etc.), wherein the DRB 110 can be formed via a desired process, such as an injection molding process (e.g., computer-implemented injection molding process), although other processes can be employed, as desired. It is to be appreciated and understood that, in accordance with various other embodiments, the DRB 110 can be formed of other types of materials (e.g., metal, such as a metal with a flexibility and resiliency similar to the DRB formed of a polymer-type material) or a combination of materials (e.g., combination of polymer and metal).

In an embodiment, the DRB 110 can be sized (e.g., perimeter or space defined and surrounded by the main frame of the DRB 110 can be sufficiently sized to be able to contain at least a defined portion of the display having a size of 9 inches (e.g., diagonally for the display screen), 12 inches, 15 inches, or a smaller or larger size) and shaped (e.g., polygonal, quadrilateral (e.g., convex quadrilateral), square, rectangular, circular, elliptical, etc.) to correspond with the respective sizes and shapes of the display 102 and bezel 104. For instance, the DRB 110 can be large enough in size to fit around and be attached to the housing, or portion thereof, of the display 102, yet still small enough to fit the DRB 110, with the display 102 attached therein, into the opening of the bezel 104. For instance, the main frame of the DRB 110 can be sufficiently sized so that the length and width of the area defined and surrounded by the main frame is at least as large as the length and width of the display housing, and the height of the main frame can be as large as, or smaller than, the height of the housing of the display 102 (e.g., the height of the display housing being the distance from the front side (e.g., the side having the display screen) to the back side (e.g., the side having the cable receptacle) of the display 102). It is to be appreciated and understood that, in accordance with other embodiments, the DRB 110 can be differently shaped or size from the display 102 and/or the bezel 104. For example, if the display 102 is significantly smaller and/or has a different shape than the bezel 104, the DRB 110 can be formed with an inside shape and size that can facilitate attachment of the DRB 110 to the display and retention of the display 102 therein, and further can have an outside shape and size that can facilitate connecting the DRB 110, with the display 102 therein, to the bezel 104 with the desired (e.g., correct) alignment in relation to the bezel 104.

In an aspect, the DRB 110 can include a plurality of display retention components (DRCs), such as DRC 112 and DRC 114, which can be formed on the inside surface of the DRB 110, and can be pin-like in structure extending outward from the inner surface of the DRB 110. The shape and size of the DRCs, such as DRCs 112 and 114, can correspond to the shape and size of the holes, such as holes 106 and 108 of the display 102, or at least can have a shape and size that enables the DRCs (e.g., 112, 114) to be inserted or slid into the corresponding holes (e.g., 106, 108) in the housing of the display 102. The number of DRCs formed on an inner side of the DRB 110 typically can correspond to the number of holes on the corresponding side of the housing of the display 102. The DRCs, such as DRCs 112 and 114, can be respectively located to correspond to the respective holes, such as holes 106 and 108, of the display 102. In one embodiment, the DRCs can be made of the same material as the main frame of the DRB 110, although it is to be appreciated and understood that, in accordance with other embodiments, the DRCs can be constructed of a different material than the main frame of the DRB 110 (e.g., the DRCs can be metal retention pins inserted or embedded into the main frame of the DRB 110, wherein the main frame can be constructed of a plastic material). It is to be appreciated and understood that FIG. 1 and certain other figures (e.g., FIG. 3) described herein depict the DRB as having two DRCs and the display housing as having two holes in its side, however, FIG. 1 and the certain other figures are only depicting portions of the DRB and display. For instance, in accordance with the disclosed subject matter, a display can have two holes on a left side of the display housing and two holes on the right side of the display housing, and the DRB can have two DRCs on a left inner surface of the DRB main frame and two DRCs on a right inner surface of the DRB main frame. For instance, in accordance with various aspects, the DRB 110 can comprise a main frame that can be configured to have a rectangular or substantially rectangular shape and a size that can enable a portion of the housing of a display 102 to be inserted into a space defined and surrounded by the main frame, wherein the portion of the housing of the display can have a defined size. The DRB can further include a plurality of DRCs (e.g., 112, 114) that can be formed on an inner surface of the main frame in locations that correspond to locations of a plurality of holes in the housing of the display 102, wherein the plurality of DRCs are configured to be slidable into the plurality of holes to retain the display 102 in the horizontal direction, without using screws, to horizontally mount the display 102 when the display 102 and the DRB 110 are inserted into a housing of a bezel 104 that does not support horizontal mounting.

In another aspect, the DRB 110 can be placed or snapped onto the display 102, wherein the respective DRCs, such as DRCs 112 and 114, can be placed, slid, or inserted into the corresponding holes, such as 106 and 108, wherein the DRCs can retain the display 102 in the horizontal direction without having to use fasteners (e.g., screws, such as M2 or other micro screws). The DRB 110 can be a semi-rigid structure such that the DRB 110 can be flexible enough to be bend to attach the DRB 110 to the display 102, wherein the DRB 110 can have a tight fit around the housing of the display 102, yet can be rigid enough so that the DRCs (e.g., 112 and 114) can retain the display 102 when the DRCs are inserted in the holes of the housing of the display 102 and rigid enough that the display 102 will not be removed from being within and attached to the DRB 110 unless a specified amount of force is applied to the DRB 110 or conversely the display 102.

In one embodiment, a cable (not shown in FIG. 1) can be connected to the display 102 prior to the attachment of the DRB 110 to the display 102 to facilitate using the DRB 110 to retain the cable (e.g., cable connector of the cable) and/or maintain the cable connection with the display 102 (e.g., maintain the cable connector in the cable receptacle of the display even when the cable connector is subjected to a predefined amount of pull-out force), as more fully disclosed herein. However, in accordance with other embodiments, as desired, the cable can be connected to the display 102 after the DRB 110 is attached to the display 102, or the display 102 can use wireless communication and/or wireless power (e.g., internal power source, external power source that transfers power wirelessly to the display 102) to thereby make a cable connection unnecessary.

As stated, the bezel 104 is structured to have the display 102 attached in the vertical direction. To facilitate securing and retaining the display 102 in the bezel 104, in still another aspect, the DRB 110 can comprise a plurality (e.g., 4, or less or more than 4) of alignment pins, such as pins 118 and 120, that can be formed on the DRB 110 in respective recessed areas, such as recessed areas 122 and 124, and can be formed to extend a specified length vertically from the base of the respective recessed areas (e.g., 122, 124) of the DRB 110. In an aspect, the alignment pins (e.g., 118, 120) can be inserted into corresponding holes (e.g., a plurality of holes or recesses), such as holes 126 and 128, formed in the bezel 104, and wherein the pins (e.g., 118, 120) can precisely align the display 102 in the x and y directions. The holes (e.g., 126, 128) of the bezel 104 can be further recessed than other portions of the inside of the bezel 104 to accommodate placement of the DRB 110, with the display 102, within the bezel 104, and placement of the extended vertical pins (e.g., 118, 120) inside the holes (e.g., 126, 128). The alignment pins (e.g., 118, 120) can facilitate aligning and holding the DRB 110 and display 102 in the bezel 104, as desired.

In yet another aspect, the system 100 can include an adapter plate 130 that can be placed against the DRB 110 and fastened to the bezel 104 using a plurality of fasteners (e.g., screws), such as fasteners 132 and 134, that can be inserted through a corresponding plurality of holes, such as holes 136 and 138, formed in the adapter plate 130, and into a corresponding plurality of holes (e.g., screw holes), such as holes 140 and 142, that can be formed in the bezel 104, to facilitate securing the display 102 and DRB 110 in the bezel 104.

The DRB 110 can thereby retain the display 102 in the horizontal direction without using fasteners, while the DRB 110 also can facilitate alignment of the display 102 in the x and y directions and retention of the display 102 in the vertical direction via the alignment pins, wherein the adapter plate 130 can be used to fasten and secure the DRB 110, with the display 102, within the bezel 104. Other aspects of a DRB are further disclosed herein in relation to the other figures.

Figure 2:
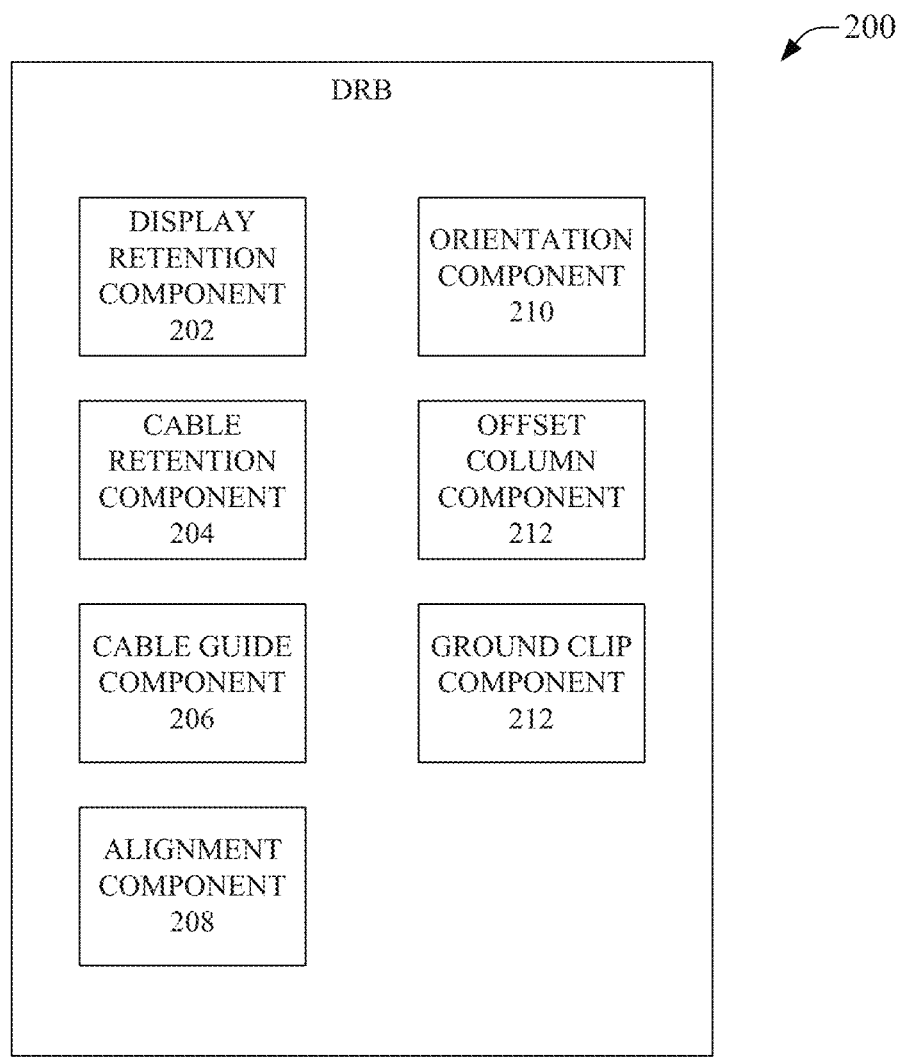
FIG. 2 depicts a block diagram of an example display retention bracket (DRB) that can facilitate retaining a display in a bezel in accordance with various aspects and embodiments.

FIG. 2 depicts a block diagram of an example DRB 200 that can facilitate retaining a display in a bezel in accordance with various aspects and embodiments. The DRB 200, display (not shown in FIG. 2), and bezel (not shown in FIG. 2) can be employed in an industrial control system, for example, although it is to be appreciated and understood that the DRB, display, and bezel, also can be employed in other types of systems, as desired.

In one aspect, the DRB 200 can include DRC 202 comprising a plurality of DRCs 202 that can be used to retain a display in a horizontal direction to horizontally mount the display without having to use fasteners, as more fully disclosed herein. The number of DRCs 202 employed typically can correspond to the number of holes contained in the display.

In another aspect, the DRB 200 also can include a cable retention component 204 that can enable a cable, comprising a cable connector associated with one or more cable wires, to withstand at least a specified amount of pull-out force to maintain connection of the cable to the display. Typically the cable wires, with a cable connector on the end of the cable wires, can be connected to the corresponding cable receptacle (e.g., receptacle, socket, or connector of the display in which the cable connector of the cable wires is plugged) on the back side of the display prior to attaching the DRB 200 to the display. In an aspect, the cable retention component 204 can be a pin or tab, which can be formed on the DRB 200 to protrude vertically downward from the main frame of the DRB 200 such that, when the DRB 200 is attached to the display, the cable retention component 204 can be located behind at least a portion of the back side of the cable connector that connects the cable wires to the cable receptacle of the display, wherein the front side of the cable connector connects to the corresponding cable receptacle of the display, and wherein the cable retention component 204 can be placed against at least a portion of the back side of the cable connector to resist movement or disconnection of the cable connector from the corresponding receptacle of the display, even when the cable connector is subjected to a predefined amount of pull-out force, such as a pull-out force based at least in part on an industrial standard. In an aspect, the cable retention component 204 can provide sufficient resistance to resist movement or disconnection of the cable connector from the corresponding receptacle when the cable connector is subjected to at least a specified amount of force (e.g., pull-out force) in the direction of pulling out of the cable connector from the corresponding cable receptacle. For example, to comply with specified industrial standards or regulations, during a pull-out test, the cable retention component 204 can provide at least a predefined amount of resistance to resist movement or disconnection of the cable connector from the corresponding receptacle when the cable connector is subjected to at least a specified amount of force (e.g., 15 Newtons (N)) in the direction of pulling out of the cable connector from the corresponding cable receptacle.

In still another aspect, the DRB 200 can include a cable guide component 206 that can be employed to maintain one or more cable wires of the cable in a desired position in relation to other components when the cable is connected to the display. The cable guide component 206 can be formed on a portion (e.g., cross member) of the DRB 200 in or near the region where the cable is connected to the display. The cable guide component 206 can be in the form of one or more channels or tracks formed between adjacent ridges or ribs formed on the DRB 200 to facilitate creating the one or more channels or tracks. When the DRB 200 is attached to the display, the one or more cable wires can be inserted in, routed via, and/or secured within, the one or more channels in the cable guide component 206 to maintain the one or more cable wires in a desired position in relation to other components associated with the display. As a result, the cable wires can be adequately prevented from moving from the one or more channels towards other components, such as high voltage components or other sensitive components, wherein, without the cable guide component 206, the cable wires potentially could move such that the cable wires could come close to contacting or could come in contact with the high voltage components or other sensitive components, which could cause harm to the cable wires, the display, and/or sensitive components.

In yet another aspect, the DRB 200 can contain an alignment component 208 that can comprise a specified number of alignment pins (e.g., polymer-based pins), which can be utilized to precisely align the DRB 200 and associated display with a bezel housing when the DRB 200 and display are placed in or on the bezel. For instance, the alignment pins of the alignment component 208 can be formed on the DRB 200 in respective positions that can correspond to respective holes in the bezel, wherein the respective alignment pins can be inserted in the respective holes to place the DRB 200 and display within the bezel with the desired alignment in relation to the bezel. The alignment pins can facilitate vertically mounting the DRB 200, with the display attached thereto, to the bezel, which only supports vertical mounting, while the DRB 200 also can retain the display in the horizontal direction to horizontally mount the display (since the display supports horizontal mounting but not vertical mounting), as more fully disclosed herein.

In accordance with still another aspect, the DRB 200 can comprise an orientation component 210 that can include a specified number (e.g., 2) of non-symmetrical tabs that can be employed to ensure the display is oriented correctly within the bezel. The specified number of non-symmetrical tabs (e.g., polymer-based non-symmetrical tabs) of the orientation component 210 can extend from one or more outer sides of the DRB 200, wherein the non-symmetrical tabs can, for example, restrict the placement of the DRB 200 and associated display in the bezel by an assembly system or an assembler such that the orientation of the DRB 200 and associated display within the bezel results in the proper display of information when the display is powered on (e.g., display will have a right-side-up orientation so that the information is presented with the desired right-side-up orientation to a user). That is, the non-symmetry of the non-symmetrical tabs can prevent the insertion of the DRB 200 into the bezel opening if the DRB 200 and associated display are oriented incorrectly (e.g., oriented 180 degrees off from the desired orientation (e.g., oriented upside down)), and/or make it obvious when the DRB 200 and associated display are oriented incorrectly, in relation to the bezel.

In yet another aspect, the DRB 200 can comprise an offset column component 212 that can include a plurality of offset columns, which can desirably offset loads on the display when an adapter plate is applied onto the DRB 200 and display, and fastened to the bezel to secure the display, while also enabling the fastening of the adapter plate to the bezel to desirably secure the display within the bezel housing. The offset columns can extend vertically upward from the main frame of the DRB 200 and away from the bezel toward the adapter plate, wherein the plurality of offset columns can facilitate providing a desired amount of clamping force to the display and a dust gasket associated with the display. In an embodiment, the offset columns can be located at or near each corner (e.g., of the 4 corners) of the main frame of the DRB 200, although, in accordance with other embodiments, the offset columns can be placed at other locations along the main frame. That is, the offset columns can facilitate applying a desired amount of clamping or compression force (via transferring force from the fastening of the adapter plate) to the display and dust gasket of the display to maintain the display and dust gasket in a desired amount of compression to facilitate desired (e.g., optimal) performance of the display and dust gasket.

In another aspect, the offset columns can be offset by a specified amount from their corresponding supports on the bottom of the DRB 200 to act or function as a compliant member for the bezel. When the adapter plate is placed onto to the DRB 200, the adapter plate can come in contact with the plurality of offset columns, and as the adapter plate is fastened to the bezel, the force of such fastening can place respective loads on the respective offset columns, which can cause the respective offset columns to respectively bend or torque in relation to the main frame of the DRB 200, resulting in an offset load on each of the respective offset columns, instead of having columns being subjected to a straight column load. That is, the respective offset columns can have a spring-like feature that allows the respective offset columns to bend by a specified amount in response to a force being placed on the respective offset columns. The offset column component 212 can thereby desirably control the amount of load on the assembly in general, and more particularly, control the amount of load applied to the display. As a result, the offset column component 212 can facilitate absorbing at least a portion of the applied load from the fastening of the adapter plate to the bezel to thereby absorb at least a portion of the tolerance associated with the assembly (e.g., assembly comprising the bezel, display, DRB 200, and adapter plate) without putting undesirably large amounts of load on the display.

In still another aspect, the DRB 200 also can comprise a ground clip component 214 that can include a ground clip (e.g., metal-type clip) that can extend the ground path from the bezel to the display to adequately ground the display in relation to the bezel and). The ground clip component 214 can be attached to the DRB 200, for example, by inserting the ground clip component 214 into a slot formed on the DRB 200. In an aspect, the ground clip component 214 can be positioned on the DRB 200 in relation to the display and bezel so that the ground clip component 214 can be in contact with a metal portion of the display (e.g., metal housing and/or ground component of the display) when the DRB 200 is attached to the display, and also can be in contact with the bezel when the DRB 200 and associated display are placed within the bezel.

Figure 3:
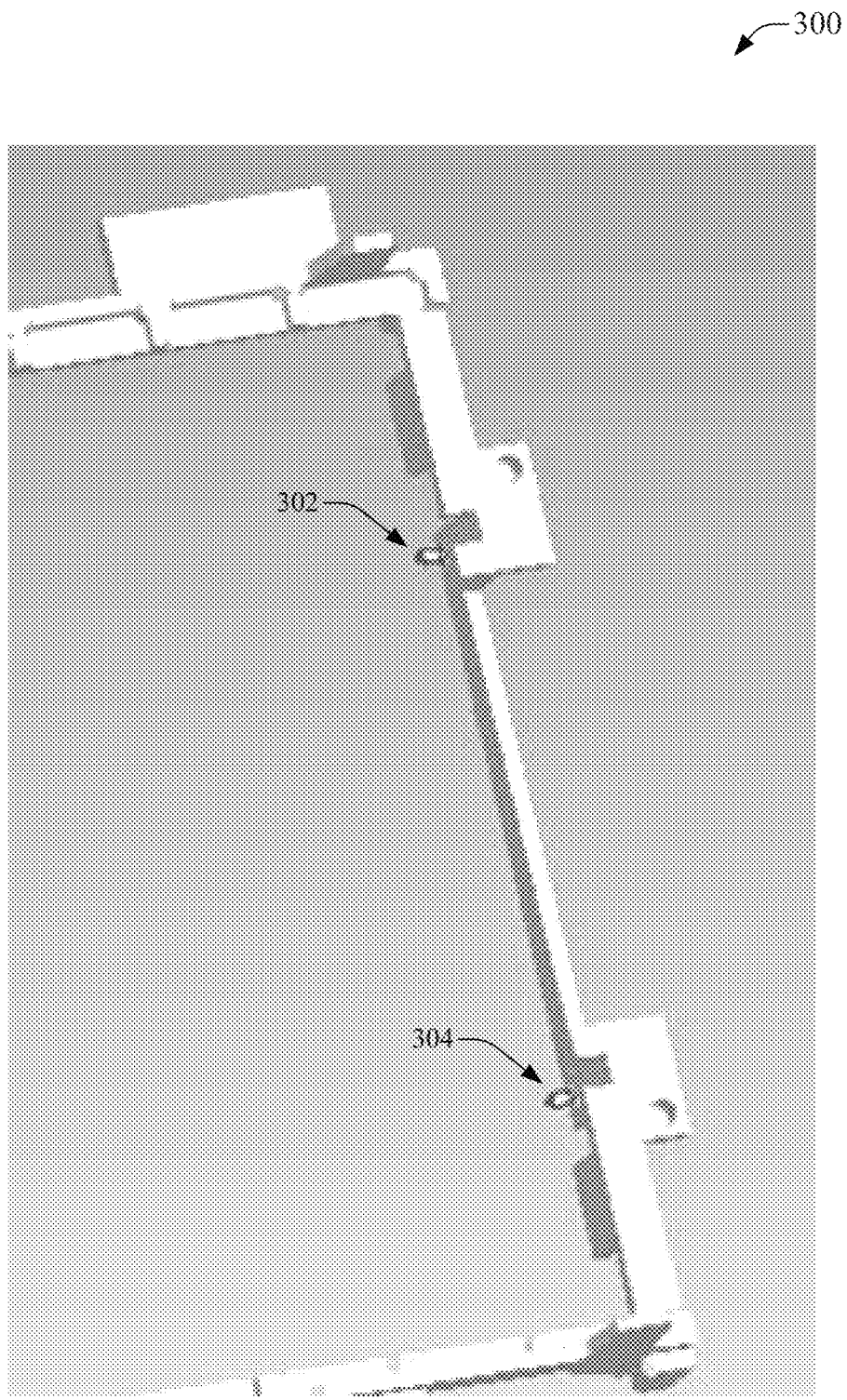
FIG. 3 depicts a diagram of an example portion of a DRB comprising display retention components (DRCs) in accordance with various aspects of the disclosed subject matter.

FIG. 3 illustrates a diagram of an example portion of a DRB 300 comprising DRCs in accordance with various aspects of the disclosed subject matter. In an aspect, the DRB portion 300 can comprise a plurality of DRCs, including DRC 302 and DRC 304, to facilitate retaining a display in a horizontal direction without having to use fasteners, when the DRB 300 is attached to the display. The DRCs, including DRC 302 and DRC 304, can be shaped and size to correspond to the shape and size of holes in the sides of the display in which the DRCs are to be inserted when the DRB is attached to the display to retain the display in the horizontal direction when the DRB and associated display are placed in the bezel. The DRB, using the DRCs (e.g., 302, 304), can eliminate the need for any fasteners in order to retain the display in the horizontal direction.

Figure 4:
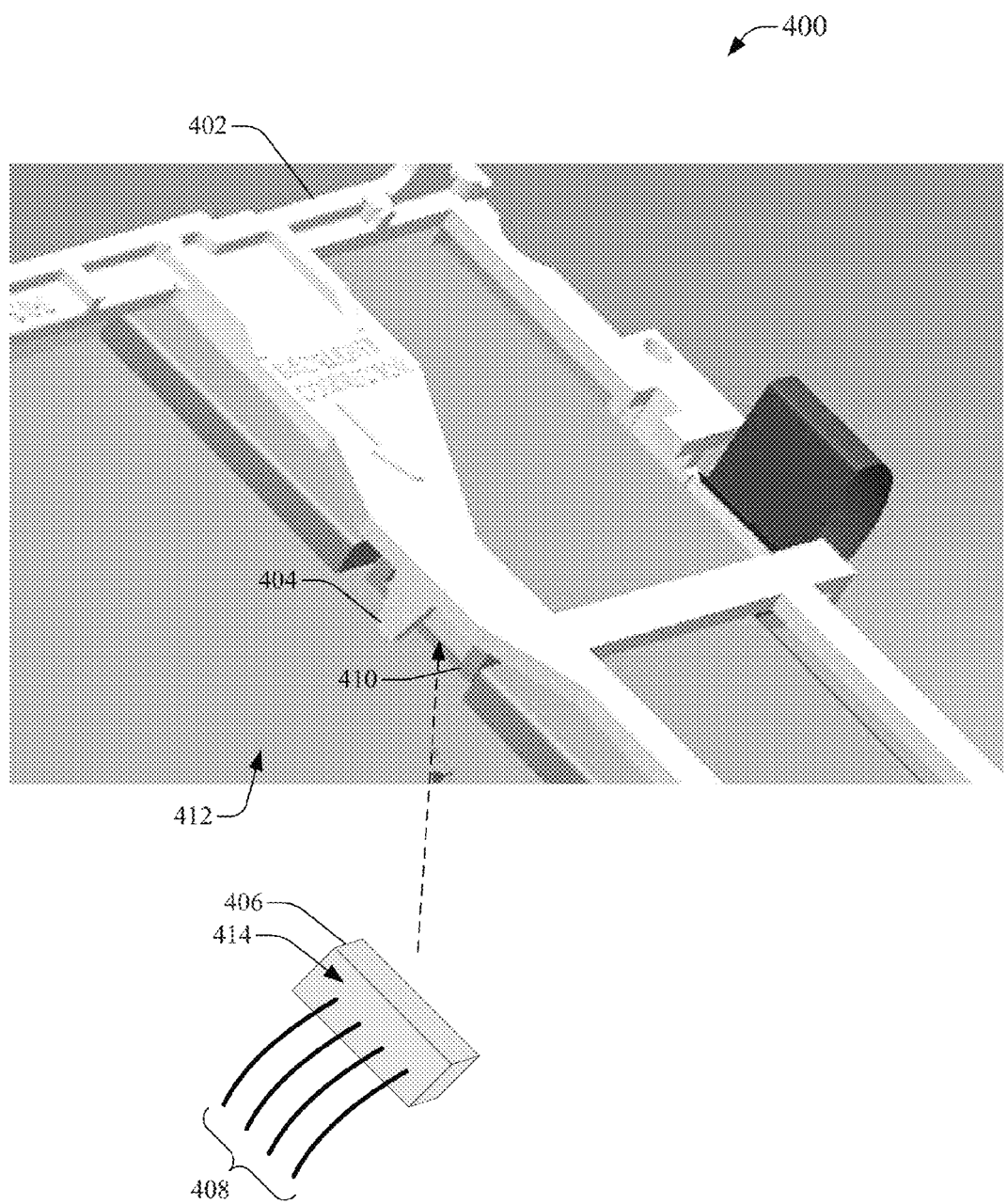
FIG. 4 illustrates a diagram of an example system that includes a DRB comprising a cable retention component in accordance with various aspects of the disclosed subject matter.

FIG. 4 presents a diagram of an example system 400 that includes a DRB comprising a cable retention component in accordance with various aspects of the disclosed subject matter. The system 400 can include a DRB 402 (a portion of the DRB 402 is shown in FIG. 4) that can include a cable retention component 404, which can be a tab or pin (e.g., finger) that can be formed in the region of the DRB 402 that corresponds with the region where the cable connector 406 of a plurality of cable wires 408 connects with (e.g., is plugged into) a receptacle 410 of a display 412 (only a portion of the display 412 is depicted in FIG. 4). The cable retention component 404 can extend away vertically from the main frame or body (e.g., extend from a cross member of the main frame) of the DRB 402 so that the cable retention component 404 can be in contact with a back side 414 of the cable connector 406 when the cable connector 406 is plugged into the receptacle 412.

In an aspect, the cable retention component 404 can provide sufficient resistance to resist movement or disconnection of the cable connector 406 from the corresponding cable receptacle 412 when the cable connector 406 is subjected to at least a specified amount of force in the direction of pulling out of the cable connector 406 from the cable receptacle 412. For example, to comply with specified regulations, during a pull-out test, the cable retention component 404 can provide at least a predefined amount of resistance to resist movement or disconnection of the cable connector 406 from the corresponding cable receptacle 412 when the cable connector is subjected to at least a specified amount of force (e.g., 15 N) in the direction of pulling out of the cable connector 406 from the cable receptacle 412.

Figure 5:
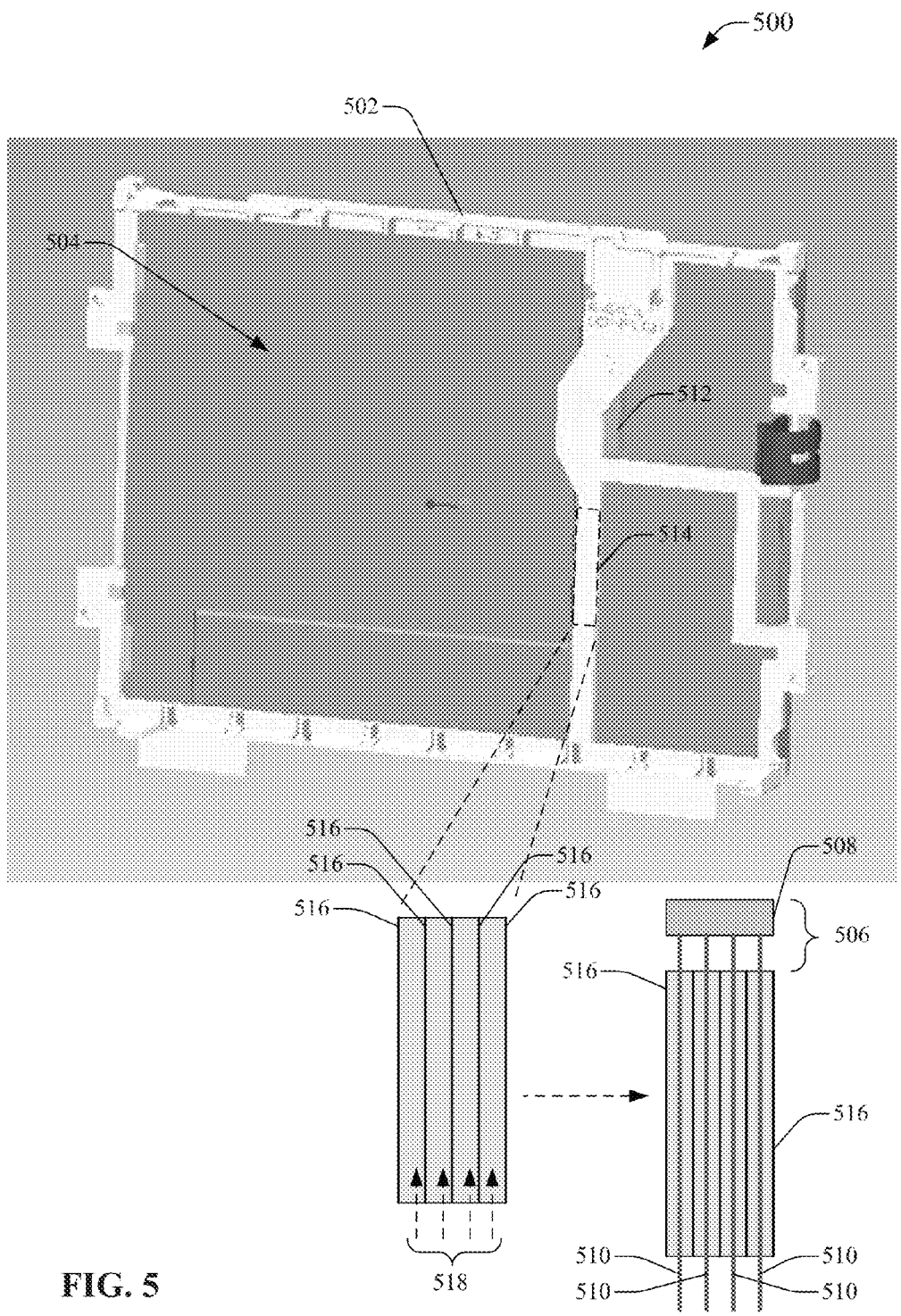
FIG. 5 depicts a diagram of an example system that can include a DRB which comprises a cable guide component to facilitate securing cable wires associated with a display in accordance with various aspects of the disclosed subject matter.

FIG. 5 illustrates a diagram of an example system 500 that can include a DRB which comprises a cable guide component to facilitate securing cable wires associated with a display in accordance with various aspects of the disclosed subject matter. The system 500 can include a DRB 502 (a portion of the DRB 502 is depicted in FIG. 5) that can be attached to a display 504 (as shown) to facilitate retaining the display 504 in a horizontal direction when the DRB 502 and associated display 504 are placed in a bezel. In an aspect, a cable 506 can include a cable connector 508 associated with a plurality of wires 510, wherein the cable connector 508 can be connected to a receptacle 512 of the display to facilitate providing power and/or enabling communication of information between the display 504 and another component.

In an aspect, the DRB 502 can contain a cable guide component 514 that can be formed on the DRB 502 in a region (e.g., on a cross member of the main frame) near the location where the cable connector 508 is connected to the receptacle 512, on the side of the DRB 502 facing the back side of the display 504. The cable guide component 514 can include a plurality of raised regions 516, wherein a plurality of cable guide channels 518 (e.g., recessed channels or regions) can be formed between each adjacent set of raised regions 516. When the cable connector 508 is inserted or plugged into the receptacle 512, at least a portion of the respective cable wires 510 can be inserted into respective cable guide channels 518 to facilitate holding or retaining the respective cable wires 510 in the cable guide channels 518 and keep the respective cable wires 510 from moving freely, as allowing the cable wires 510 to move freely may result in the cable wires coming into contact with other components (e.g., high voltage components, heat generating components, sensitive components, etc.), which could result in a malfunction (e.g., damaged cable wires, short circuited wire, etc.). In accordance with various embodiments, as desired, the size (e.g., width) and shape of the cable channel guides 518 can be such that the cable wires 510 are more firmly retained by (e.g., snapped into) the cable channel guides 518, or can be less firmly retained by the cable channel guides 518 wherein the cable wires 510 can be inserted, without having to snap the cable wires 510, into the cable channel guides 518.

Figure 6:
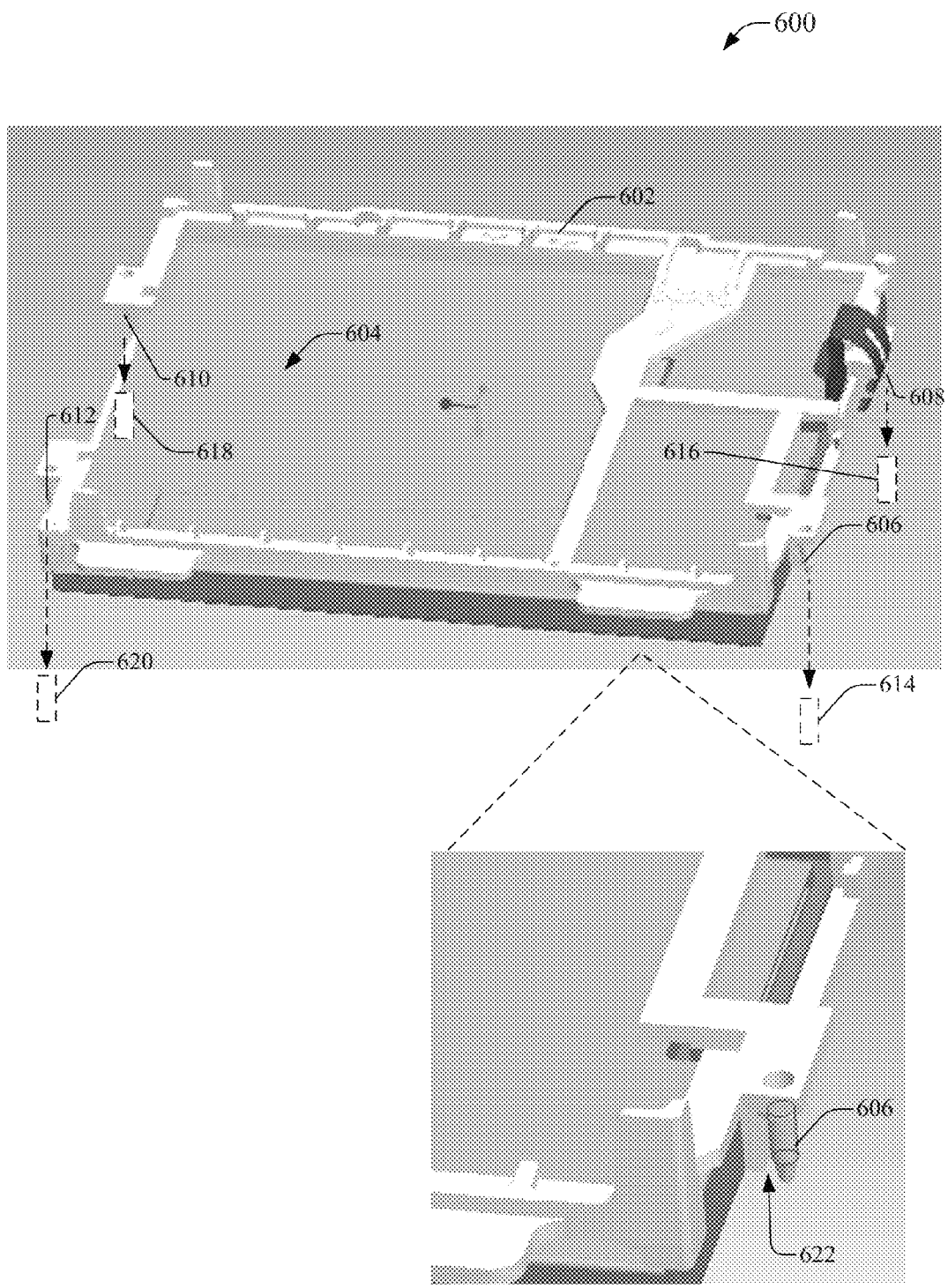
FIG. 6 illustrates a diagram of an example system that can include a DRB which comprises an alignment component to facilitate aligning a display in relation to a bezel in accordance with various aspects of the disclosed subject matter.

FIG. 6 depicts a diagram of an example system 600 that can contain a DRB which comprises an alignment component to facilitate aligning a display in relation to a bezel in accordance with various aspects of the disclosed subject matter. The system 600 can comprise a DRB 602 and a display 604, wherein the DRB 602 can be attached to a display 604, in accordance with various aspects, as more fully disclosed herein.

In an aspect, the DRB 602 can include an alignment component comprising a plurality of alignment pins, such as alignment pins 606, 608, 610 and 612, that can be formed in respective locations of the DRB 602 that can correspond to respective locations of recessed areas, such as recessed areas 614, 616, 618 and 620 of the bezel (the bezel is not shown in FIG. 6, but representations of the recessed areas 614 through 620 of the bezel are included in FIG. 6 for reference), wherein the respective alignment pins 606, 608, 610 and 612 can be inserted into the respective recessed areas 614, 616, 618 and 620 of the bezel to facilitate precisely aligning the DRB 602 and associated display 604 with the bezel. In another aspect, the alignment pins 606, 608, 610 and 612 can be formed in respective recessed regions, such as, for example, recessed region 622, of the DRB 602 to facilitate enabling the DRB 602 and associated display 604 to be inserted into the opening and placed within the bezel. In an embodiment, the alignment pins 606, 608, 610 and 612 can be shaped to have a cone-like end to facilitate insertion of (e.g., make it easier to insert) the alignment pins 606, 608, 610 and 612 in the respective recessed areas 614, 616, 618 and 620.

Figure 7:
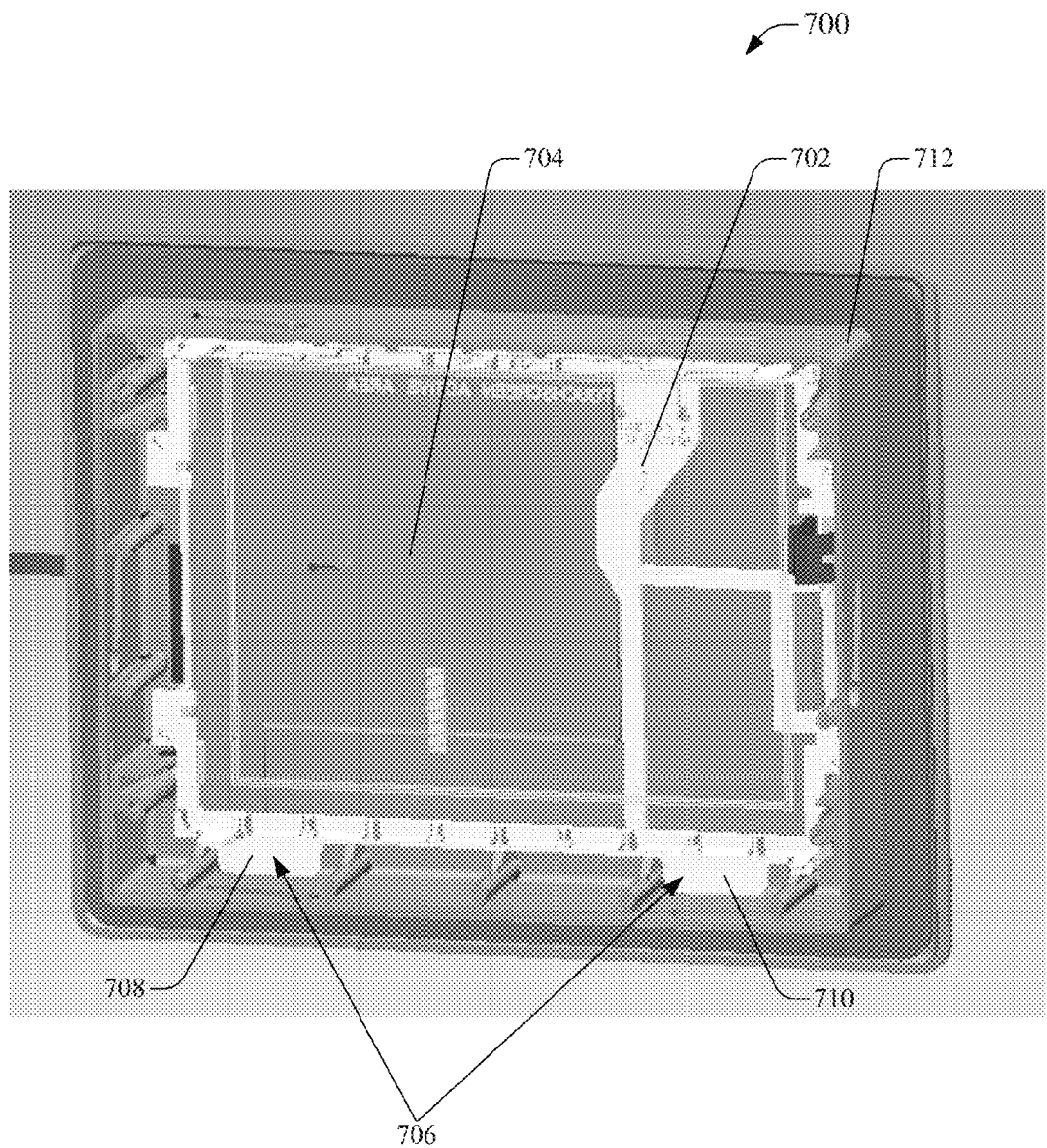
FIG. 7 depicts is a diagram of an example system that can contain a DRB which comprises an orientation component to facilitate proper orientation of a display when the display is inserted in a bezel in accordance with various aspects of the disclosed subject matter.

FIG. 7 illustrates a diagram of an example system 700 that can contain a DRB which comprises an orientation component to facilitate proper orientation of a display when the display is inserted in a bezel in accordance with various aspects of the disclosed subject matter. The system 700 can include a DRB 702 and a display 704, which can be attached to the DRB 702, in accordance with various aspects, as more fully disclosed herein.

In an aspect, the DRB 702 can comprise an orientation component 706 that can comprise a plurality of non-symmetrical tabs, such as non-symmetrical tabs 708 and 710, that can be formed on the DRB 702 to facilitate desirably orienting the DRB 702 and associated display 704 when the DRB 702 and display 704 are inserted into the bezel 712. The non-symmetrical tabs 708 and 710 can be non-symmetrical in relation to the bezel 712 such that placement of the DRB 702 and associated display 704 in the bezel 712 can be restricted during insertion of the DRB 702 into the opening of the bezel 712 when an assembly system or an assembler is inserting the DRB 702 into the bezel 712 such that the DRB 702 and associated display 704 only can be placed within the bezel 712 in one orientation resulting in display 704 being properly oriented to properly display information when the display is powered on (e.g., display will have a right-side-up orientation so that the information is presented with the desired right-side-up orientation to a user). The non-symmetrical tabs 708 and 710 of the orientation component 706 can prevent or inhibit insertion of the DRB 702 into the opening of the bezel 712 if the DRB 702 and associated display 704 are oriented incorrectly (e.g., oriented 180 degrees off from the desired orientation (e.g., oriented upside down)), and/or make it obvious (e.g., to the assembler or assembly system) when the DRB 702 and associated display 704 are oriented incorrectly, in relation to the bezel 712.

Figure 8:
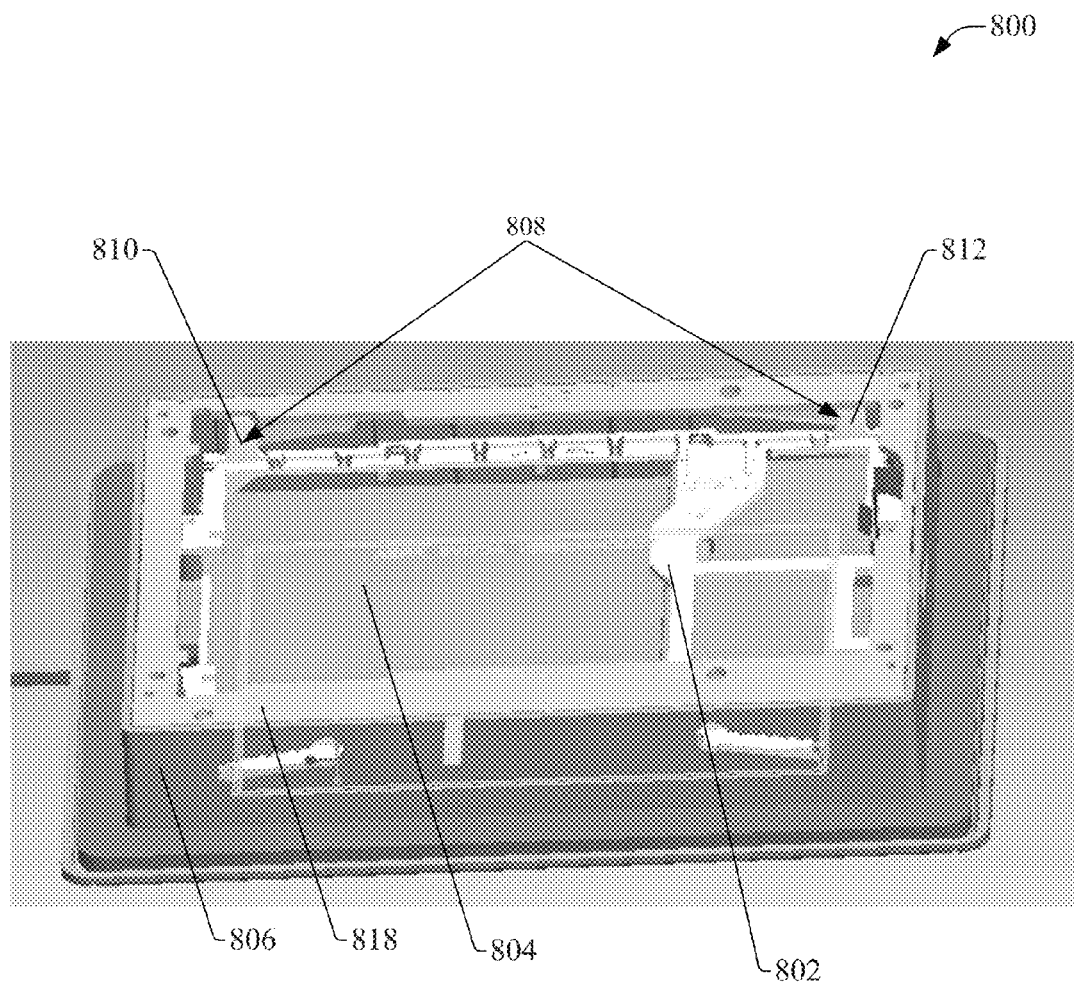
FIG. 8 is a diagram that illustrates an example system that can contain a DRB which comprises an offset column component in accordance with various aspects of the disclosed subject matter.
Figure 9:
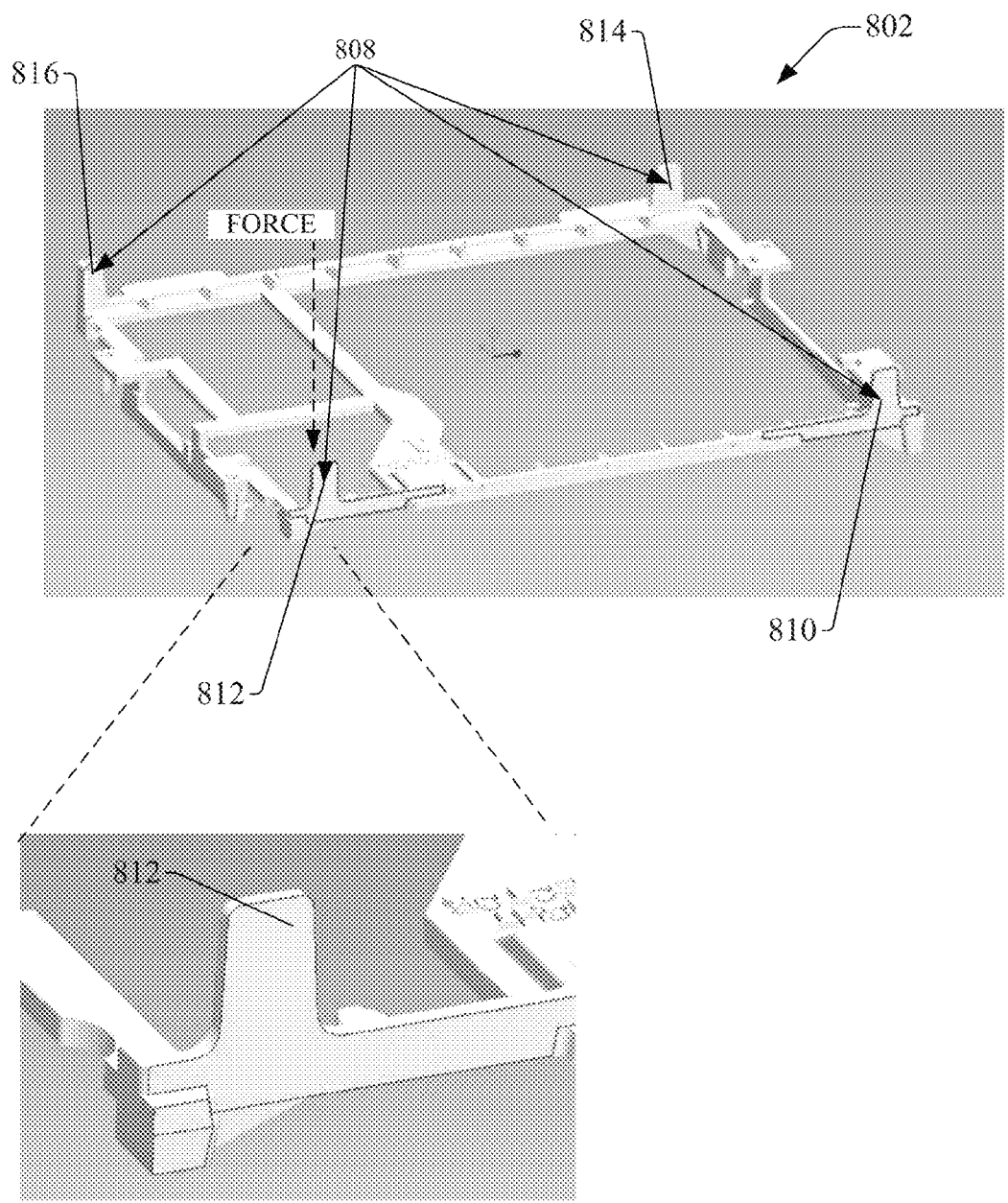
FIG. 9 presents a diagram of an example DRB, comprising the offset column component, to facilitate offsetting loads associated with a display when the display and DRB are inserted in a bezel in accordance with various aspects of the disclosed subject matter.

Turning to FIGS. 8 and 9, FIG. 8 depicts a diagram of an example system 800 that can contain a DRB 802 which comprises an offset column component, and FIG. 9 illustrates a diagram of an example DRB 802 comprising the offset column component, to facilitate offsetting loads associated with a display when the display and DRB are inserted in a bezel in accordance with various aspects of the disclosed subject matter. The system 800 can include a DRB 802 and a display 804, wherein the DRB 802 can be attached to the display 804, in accordance with various aspects, as more fully disclosed herein. The DRB 802 and associated display 804 can be placed in a bezel 806 with the display 804 having the desired orientation in relation to the bezel 806.

In an aspect, the DRB 802 can comprise an offset column component 808 comprising a plurality of offset columns, such as, for example, offset column 810 and offset column 812, offset column 814 (as shown in FIG. 9) and offset column 816 (as shown in FIG. 9), where the respective offset columns 810, 812, 814 and 816 can desirably offset loads on the display when an adapter plate 818 is applied onto the DRB 802 and display 804, and fastened to the bezel 806 to secure the display 804, while also enabling the fastening of the adapter plate 818 to the bezel 806 to desirably secure the display 804 within the bezel 806. A specified number of fasteners (e.g., screws, such as micro screws) (not shown in FIGS. 8 and 9) can be used to tighten down and fasten the adapter plate 818 onto bezel 806. In an aspect, the offset columns 810, 812, 814 and 816 can extend vertically upward from the main frame of the DRB 802 and away from the bezel 806 toward the adapter plate 818, wherein the plurality of offset columns 810, 812, 814 and 816 can facilitate providing a desired amount of clamping force to the display 804 and a dust gasket associated with the display 804. That is, the plurality of offset columns 810, 812, 814 and 816 can facilitate respectively applying a desired amount of clamping or compression force (via transferring force from the fastening of the adapter plate) to the display 804 and dust gasket of the display to maintain the display 804 and dust gasket in a desired amount of compression to facilitate desired (e.g., optimal) performance of the display 804 and dust gasket.

In another aspect, the offset columns 810, 812, 814 and 816 can be offset by a specified amount from their corresponding supports on the bottom of the DRB 802 to act or function as a compliant member for the bezel 806. When the adapter plate 818 is placed onto to the DRB 802, display 804, and bezel 806, the adapter plate 818 can come in contact with the plurality of offset columns 810, 812, 814 and 816, and as the adapter plate 818 is fastened to the bezel 806, the force of such fastening can place respective loads on the respective offset columns 810, 812, 814 and 816, which can cause the respective offset columns 810, 812, 814 and 816 to respectively bend or torque in relation to the main frame of the DRB 802, resulting in respective offset loads on each of the respective offset columns 810, 812, 814 and 816, instead of having columns being subjected to a straight column load. That is, the respective offset columns 810, 812, 814 and 816 can have a spring-like feature that allows the respective offset columns 810, 812, 814 and 816 to bend by a specified amount in response to a force being placed on the respective offset columns 810, 812, 814 and 816. In an aspect, to facilitate implementation of the spring-like feature, one end of an offset column (e.g., 810, 812, 814, 816) can be attached to the main frame of the DRB 802, while at least an arm of the offset column can be unattached from, or not connected to, the main frame of the DRB 802, wherein there can be a specified amount of space between the arm and the main frame to allow the arm to move (e.g., at least move until the arm comes in contact with the main frame), and the offset column to move about an axis at the attached end of the offset column, in response to a force applied to the top of the arm in the direction of the main frame. This can allow the offset column to offset or absorb at least a portion of the force being applied to the offset column. The offset column component 808, by employing the offset columns 810, 812, 814 and 816, can thereby desirably control the amount of load on the assembly (e.g., assembly comprising DRB 802, display 804, bezel 806, adapter plate 818) in general, and more particularly, control the amount of load applied to the display 804. As a result, the offset column component 808 can facilitate absorbing at least a portion of the applied load from the fastening of the adapter plate 818 to the bezel 806 to thereby absorb at least a portion of the tolerance associated with the assembly without putting undesirably large amounts of load on the display 804.

Figure 10:
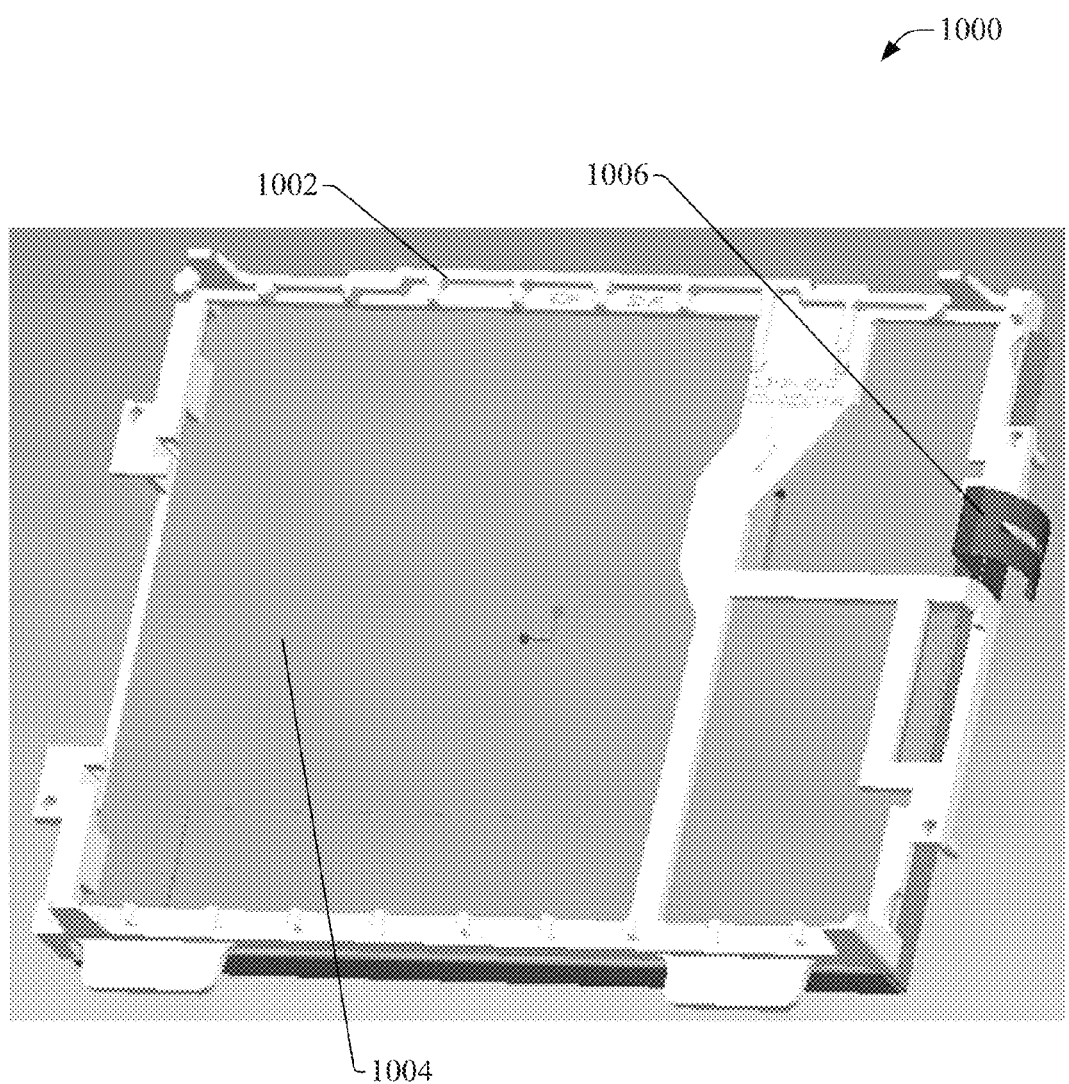
FIG. 10 illustrates a diagram of an example system that can be utilized to form a DRB in accordance with various aspects and embodiments of the disclosed subject matter.

FIG. 10 depicts a diagram of an example system 1000 that can employ a DRB comprising a ground clip component to facilitate grounding an associated display when placed in a bezel in accordance with various aspects of the disclosed subject matter. The system 1000 can include a DRB 1002 and a display 1004, wherein the DRB 1002 can be attached to the display 1004, in accordance with various aspects, as more fully disclosed herein. The DRB 1002 and associated display 1004 can be placed in a bezel (not shown in FIG. 10) with the display 1004 having the desired orientation in relation to the bezel.

In an aspect, the DRB 1002 can comprise a ground clip component 1006 that can be attached to the DRB 1002 in a desired location on the DRB 1002 such that the ground clip component 1006 can simultaneously be in contact (e.g., physically and electrically) with the bezel when the DRB 1002 and associated display 1004 are inserted into the bezel opening and be in contact with the display 1004 when the DRB 1002 is attached to the display 1004. In an embodiment, the ground clip component 1006 can comprise a ground clip, which can be formed of a desired conductive metal material. The ground clip can be attached to the DRB 1002, for example, by inserting the ground clip into a slot formed on the DRB 1002, wherein the ground clip component 1006 can be positioned on the DRB 1002 in relation to the display 1004 and bezel so that the ground clip component 1006 can be in contact with both a metal portion associated with the display 1004 (e.g., metal housing and/or ground component of the display 1004) and metal portion associated with the bezel (e.g., inside surface of metal housing and/or ground component of the bezel) when the DRB 1002 and associated display 1004 are inserted into the bezel housing.

Typically, the ground clip can be formed to have a certain amount of flexibility or a spring-like feature, wherein the ground clip can have a portion of the ground clip that extends outward from the frame of the DRB 1002, and wherein the ground clip can be structured to have its outside surface, which can be facing, and coming in contact with, the inside surface of the bezel, be compressed inward when the DRB 1002 is inserted into the bezel. As a result of the inward compression of the ground clip, the ground clip can have a corresponding or responsive outward springing force in the opposite direction of the inward compression when the DRB 1002 and ground clip are placed in the bezel. As a result, when the ground clip is in the bezel, the ground clip can maintain contact with the inside surface of the housing of the bezel. As a further result, the ground path associated with the bezel can be extended to the ground clip component 1006, wherein the ground clip component 1006 can extend that ground path to the display 1004, which can be in contact with (e.g., in electrical and physical contact with) the ground clip component 1006 to thereby adequately ground the display 1004 in relation to the bezel and/or other associated components of the system (e.g., industrial control system).

Figure 11:
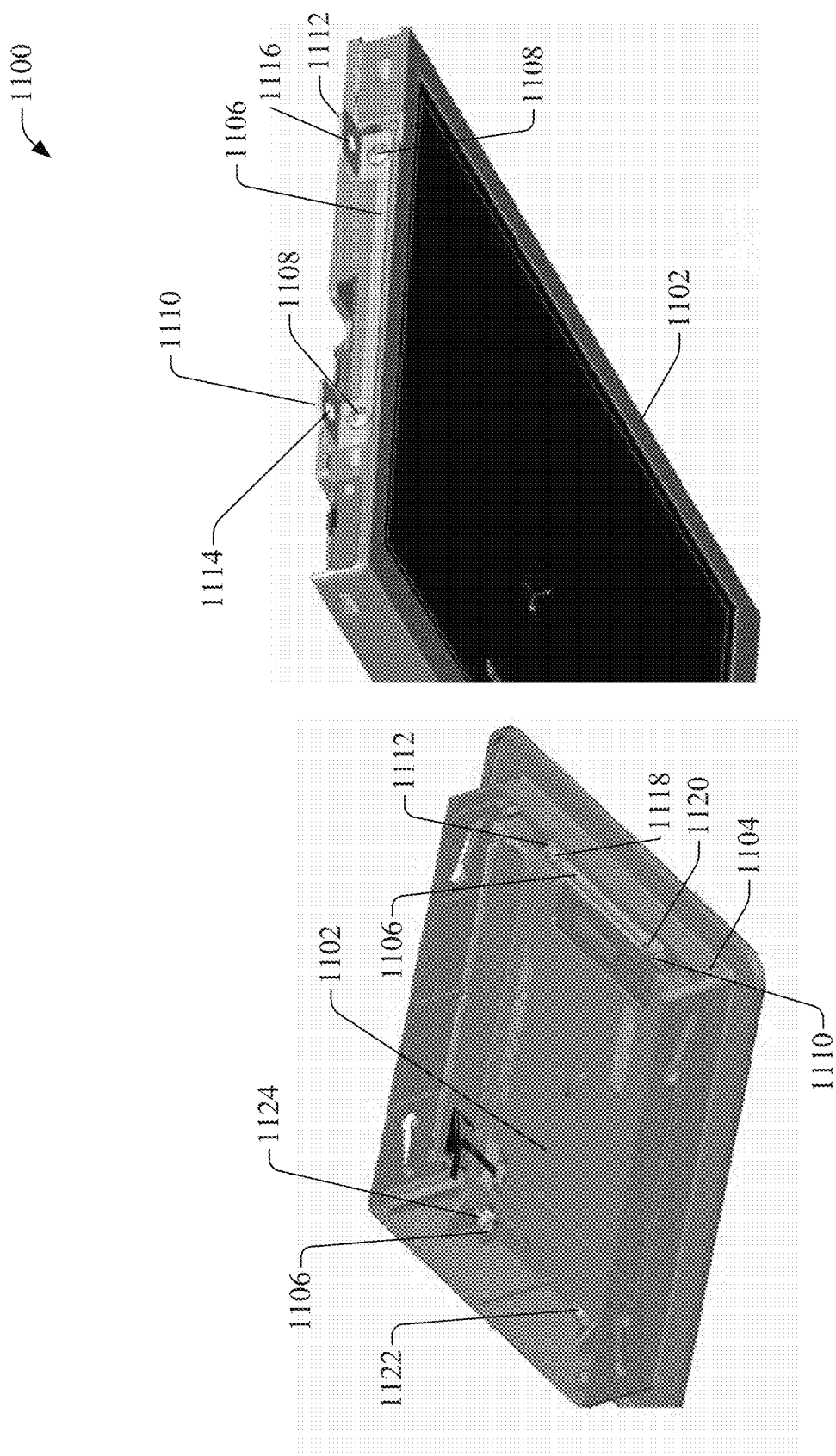
FIG. 11 illustrates a diagram of an example system that employs a set of DRBs (e.g., side screw mounting brackets) to retain a display in a bezel in accordance with various aspects and embodiments of the disclosed subject matter.

FIG. 11 illustrates a diagram of an example system 1100 that employs a set of DRBs (e.g., side screw mounting brackets) to retain a display in a bezel in accordance with various aspects and embodiments of the disclosed subject matter. In an aspect, the system 1100 can include a display 1102 (a portion of the display 1102 is shown in FIG. 11) and a bezel 1104. In another aspect, the system 1100 can include a set of DRBs, including DRB 1106, that can be used to vertically mount the display 1102 in the housing of the bezel 1104, even though the display 1102 has holes in the sides of the display housing in the horizontal direction, and thus supports horizontal mounting, but not vertical mounting.

In accordance with an aspect, each of the DRBs 1106 can be formed of a desired material (e.g., metal material, such as a conductive metal material; polymer-type material) and structured to have holes (wherein fasteners 1108 are inserted) corresponding in location and/or size to the holes in the side of the housing of the display 1102, and the DRBs 1106 can be attached in a horizontal direction by inserting the fasteners 1108 through the holes in the DRBs 1106 into the holes in the housing of the display 1102, wherein the fasteners 1108 can be tightened down to secure or fasten the DRBs 1106 to the housing of the display 1102. In an aspect, each of the DRBs 1106 can be further structured to have a specified number of extended portions, such as extended portions 1110 and 1112, that proceed outward from the display housing and perpendicular to the portion of the DRB 1106 that is fastened to the display housing. The extended portions 1110 and 1112 can have respective holes 1114 and 1116 that can correspond in location and/or size to the holes in the bezel housing and the DRBs 1106 and associated display 1102 can be inserted into the bezel 1104, and the DRBs 1106 and associated display can be fastened, using fasteners 1118, 1120, 1122 and 1124 inserted through the holes (e.g., 1114, 1116) of each of the DRBs 1106 and into the holes in the housing of the bezel 1104 (wherein, in FIG. 11, the fasteners 1118 through 1124 are shown already inserted in the holes in the bezel housing) in the vertical direction to vertically mount the DRBs 1106 and associated display 1102. The DRBs 1106 can thereby retain the display 1102 in the bezel 1104. Further, if the DRBs 1106 are formed of a conductive metal material, the DRBs 1106 can desirably ground the display 1102 in relation to the bezel 1104.

Figure 12:
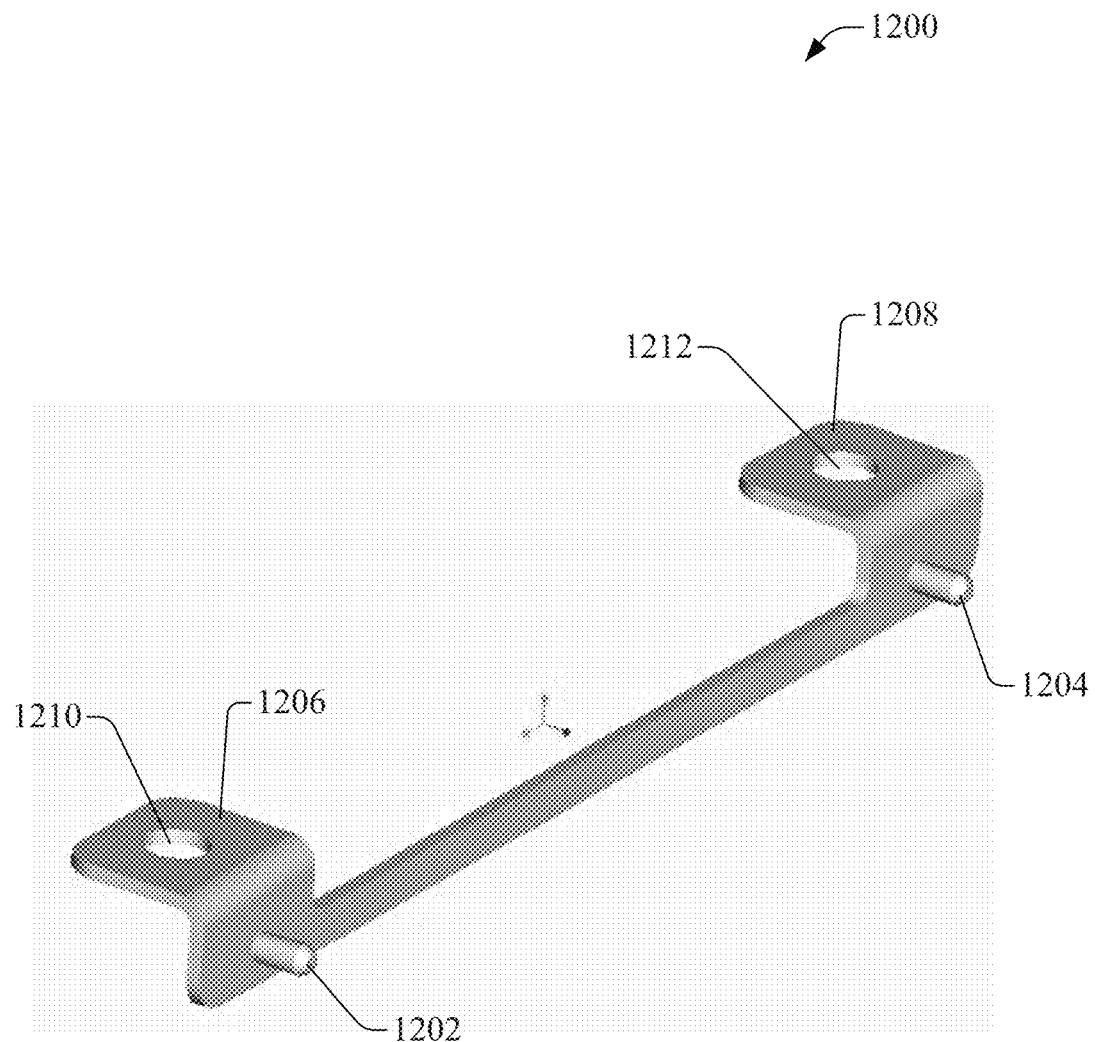
FIG. 12 depicts a diagram of an example DRB with side mounting features in accordance with another embodiment of the disclosed subject matter.

FIG. 12 depicts a diagram of an example DRB 1200 with side mounting features in accordance with another embodiment of the disclosed subject matter. The DRB 1100 can be similar in size, shape, and structure as DRB 1106 of FIG. 11, except that DRB 1200 can employ DRCs 1202 and 1204 (e.g., pins, studs), which can be inserted into holes in a housing of a display (not shown in FIG. 12) to facilitate retaining the display in the horizontal direction, instead of using fasteners. Similar to DRB 1106, the DRB 1200 can include extended portions 1206 and 1208, wherein the respective extended portions 1206 and 1208 can be formed to have holes 1210 and 1212, which can be used to facilitate vertically mounting the DRB 1200 and associated display in the housing of a bezel (not shown in FIG. 12). Fasteners (not shown) can be inserted through the holes 1210 and 1212 into corresponding holes (not shown) in the housing of the bezel, and the fasteners can be tightened down to secure the display and DRB 1200 in the bezel. This DRB arrangement can eliminate the need for fasteners to fasten the DRB(s) to the display housing. Further, if the DRB(s) is constructed of a conductive metal material, the DRB(s) can maintain grounding of the display with the bezel. Also, this DRB arrangement can allow the dust gasket (not shown) associated with the display to be preloaded.

Figure 13:
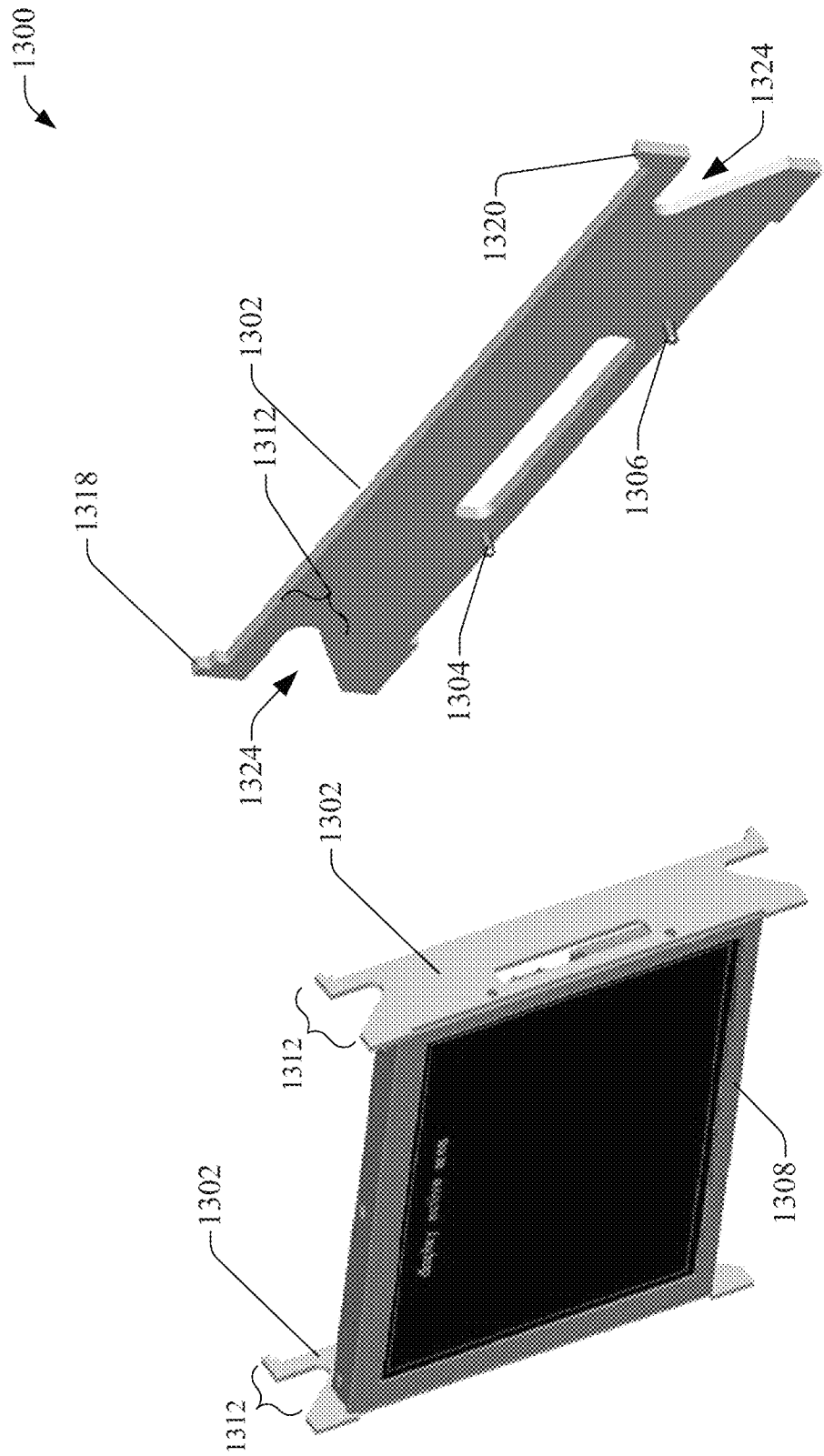
FIGS. 13 and 14 illustrate diagrams of an example system that can be employ DRBs that comprise a slide-in feature for side mounting of a display in accordance with still other aspects and embodiments of the disclosed subject matter.

FIG. 13 illustrates a diagram of an example system 1300 that can be employ DRBs that comprise a slide-in feature for side mounting (e.g., in the horizontal direction) of a display in accordance with still other aspects and embodiments of the disclosed subject matter. In an aspect, the system 1300 can include a set of DRBs (e.g., a DRB that can be attached to the left side of the display housing, and a DRB that can be attached to the right side of the display housing), including DRB 1302, wherein the DRB 1302 can be a slide-in bracket with side mounting. The DRB 1302 can be formed of a desired material (e.g., metal material, such as a conductive metal material; polymer-type material) and structured to have DRCs, such as DRCs 1304 and 1306, corresponding in location and/or size to the holes (not shown in FIG. 13) in the side of the housing of the display 1308, and the DRB 1302 can be inserted into and/or attached to the housing of the display 1308 in a horizontal direction by inserting the DRCs 1304 and 1306 (e.g., pins, studs) into the corresponding holes in the housing of the display 1308.

Figure 14:
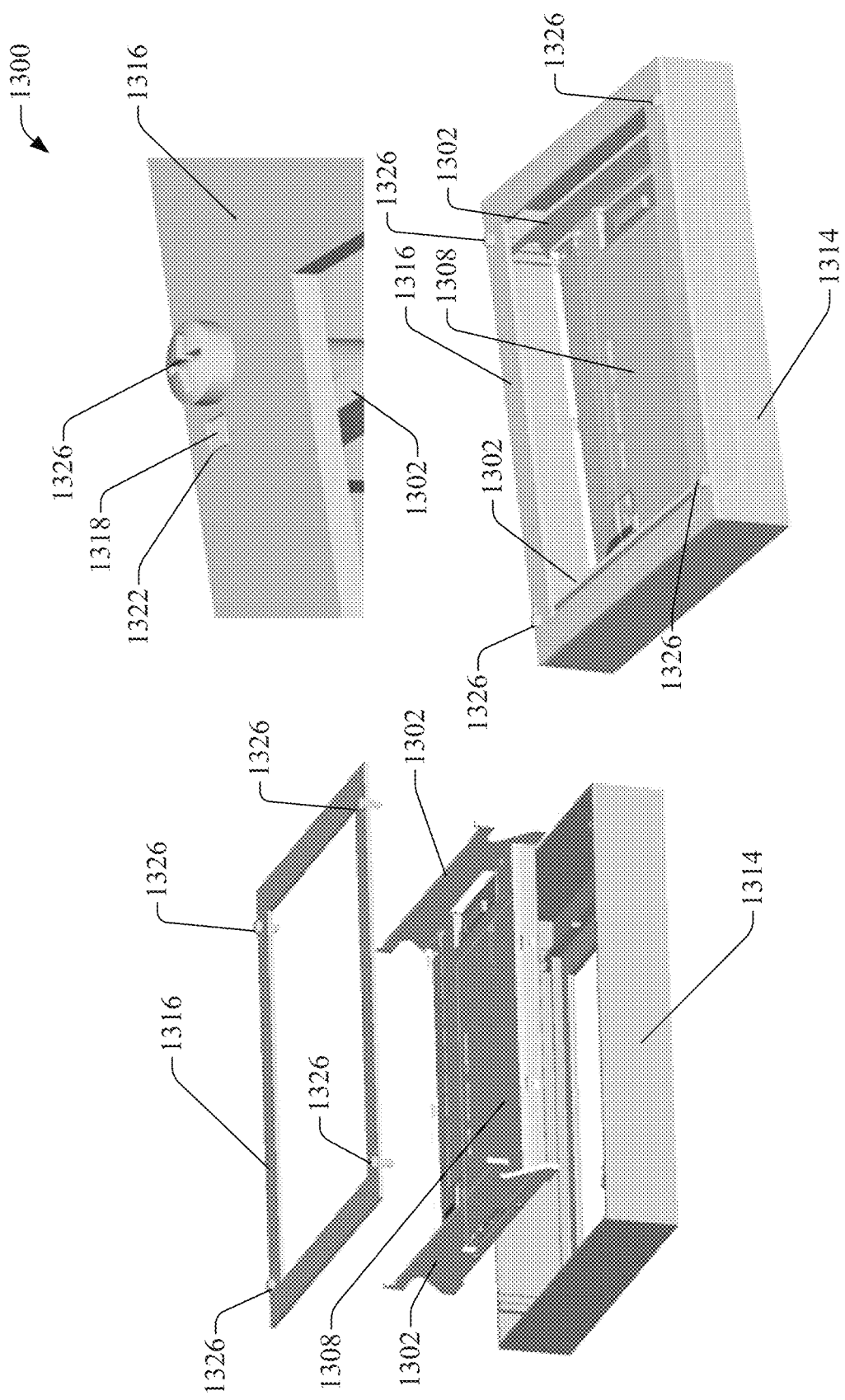

Referring briefly to FIG. 14 (along with FIG. 13), FIG. 14 illustrates a diagram of the other portions of system 1300 in accordance with various aspects and embodiments. In an aspect, the DRB 1302 can be further structured to have an extended portion 1312 that extends upward vertically past the point where the back side of the display 1308 ends to a point wherein when the display 1308 and DRB 1302 are inserted into the housing of the bezel 1314, the top end or point of the extended portion 1312 of the DRB(s) can be where the adapter plate 1316 (e.g., backing retainer plate) can be attached to the housing of the bezel 1314. In an aspect, the top of the extended portion 1312 of the DRB 1302 can have one or more protruding portions, such as protruding portions 1318 and 1320, and the adapter plate 1316 can have one or more holes, such as holes 1322 and 1324, that can correspond in size and/or shape to the protruding portions 1318 and 1320, wherein the protruding portions 1318 and 1320 can be inserted into the corresponding hole 1322 in the adapter plate 1316 when the adapter plate 1316 is attached to the housing of the bezel 1314. The adapter plate 1316 can thereby secure the DRBs 1302 and associated display 1308 in place within the housing of the bezel 1314, wherein the assembly (e.g., display, DRBs, etc.) can be positioned on the dust gasket in the bezel assembly. The DRBs 1302 can have a load limiting feature, wherein the extended portion 1312 of each of the DRBs 1302 can have one or more cutaway portions, such as cutaway portions 1324, wherein the protruding portions 1318 and 1320 are thereby able to absorb at least a portion of the load placed on the DRBs 1302, display 1308, and associated dust gasket by the adapter plate 1316 when fastened to the housing of the bezel 1314 by fasteners 1326.

Figure 15:
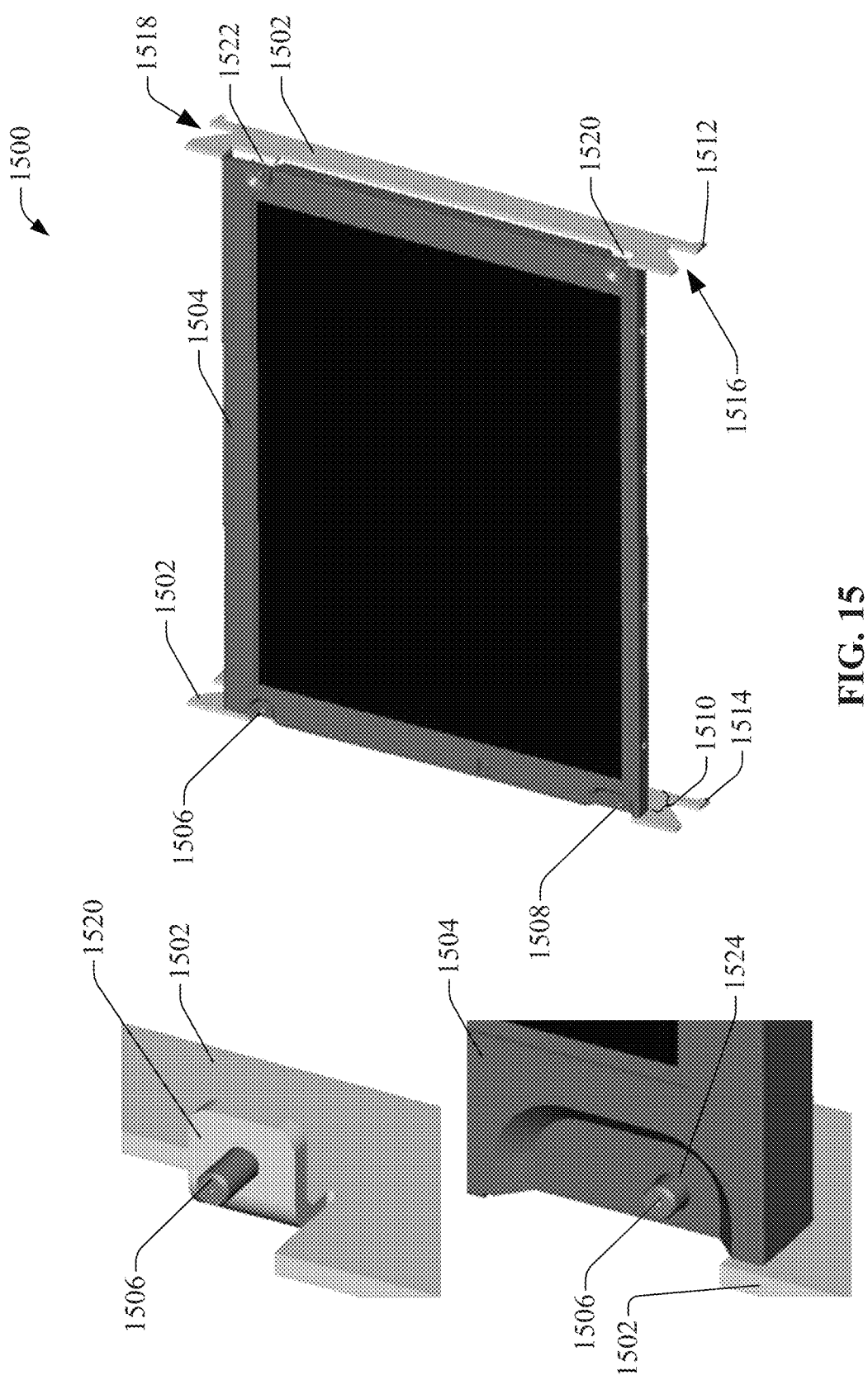
FIGS. 15 and 16 depict diagrams of an example system that can employ DRBs comprising a slide-in bracket feature for retaining a display having through-hole mounting, in accordance with various aspects and embodiments of the disclosed subject matter.
Figure 16:
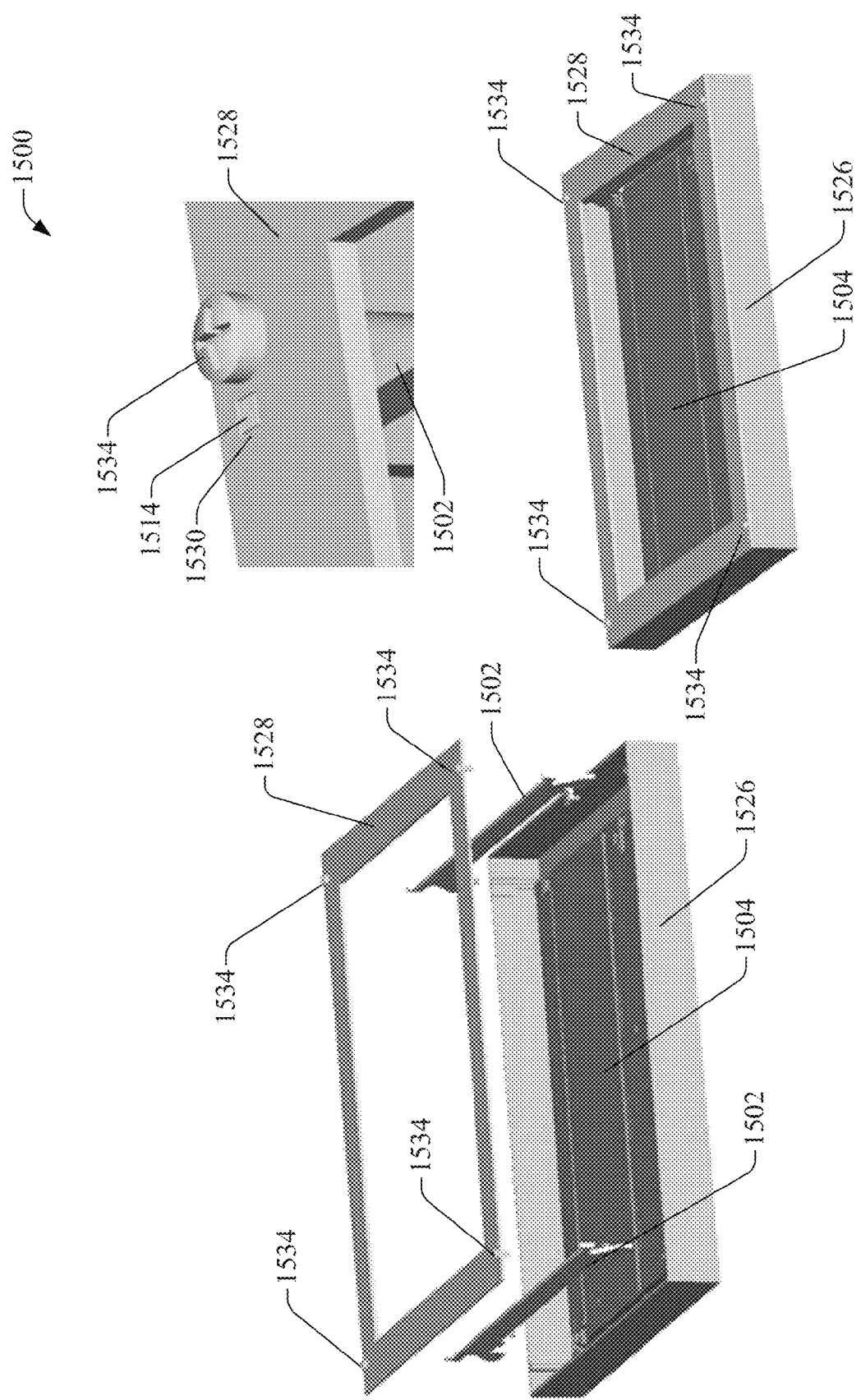

FIGS. 15 and 16 depict diagrams of an example system 1500 that can employ DRBs comprising a slide-in bracket feature for retaining a display having through-hole mounting, in accordance with various aspects and embodiments of the disclosed subject matter. In accordance with various aspects, the system 1500 can comprise a specified number (e.g., 2) DRBs 1502, which can be structured substantially similar to the DRB 1302 described with regard to FIGS. 13 and 14, except that the DRBs 1502 can be differently structured from the DRB 1302 such that the DRB 1502 can be structured to mount a display 1504 that has through hole mounting (e.g., in the vertical direction), instead of side mounting (e.g., in the horizontal direction). In accordance with various aspects, similar to DRB 1302, the DRB 1502 can comprise DRCs 1506 and 1508, extended portion 1510, protruding portions 1512 and 1514, and cutaway portions 1516 and 1518.

In one aspect, the DRB 1502 can be formed to have one or more retention regions, such as retention regions 1520 and 1522, that extend inward toward the display 1504 (when the DRB 1502 is being attached to the display 1504) and are perpendicular, or at least substantially perpendicular, to the extended portion 1510. The retention regions 1520 and 1522 each can include the DRCs 1506 and 1508.

In another aspect, the display 1504 can have a desired number of holes 1524 that can be formed on the display housing at or near the four corners of the display housing in the vertical direction, from the back side of the display 1504 through to the front side (e.g., screen side) of the display 1504, instead of being side mounted (e.g., in the horizontal direction). The DRCs 1506 and 1508 of each of the DRBs 1502 can be inserted or slid into the corresponding holes 1524 on the display 1504 via the back side of the display 1504 to facilitate retaining the display 1504 when mounted in the bezel 1526, as shown in FIG. 16. Similar to the adapter plate 1316 of system 1300, the system 1500 can include an adapter plate 1528 that can include a specified number (e.g., 4) of holes 1530 located on the adapter plate 1528 to correspond with the location of the protruding portions 1512 and 1514 of the DRBs 1502 when the DRBs 1502 and associated display 1504 are placed inside the housing of the bezel 1526, and the adapter plate 1528 is placed on the housing of the bezel 1526, wherein the protruding portions 1512 and 1514 can be inserted into the holes 1530 on the adapter plate 1528, and wherein the adapter plate 1528 can be clamped down on the bezel 1526 using fasteners 1532 inserted through holes on the adapter plate 1528 into corresponding holes in the housing of the bezel 1526. This DRB arrangement can desirably retain the display 1504 without the DRB 1502 having to use fasteners (e.g., screws). Also, when the DRB 1502 is constructed of a conductive metal material, the DRB 1502 can facilitate grounding of the display 1504 in relation to the bezel 1526. Further, the extended portion 1512, formed with the cutaway portions 1516 and 1518, of the DRBs 1502 can be employed to control (e.g., limit or reduce) the amount of load applied to the display 1504 and associated dust gasket, as the DRBs 1502 can absorb at least part of the load applied to the DRBs 1502 by the adapter plate when attached to the bezel 1526 so that the display 1504 and associated dust gasket are not subjected to the entire load.

Figure 17:
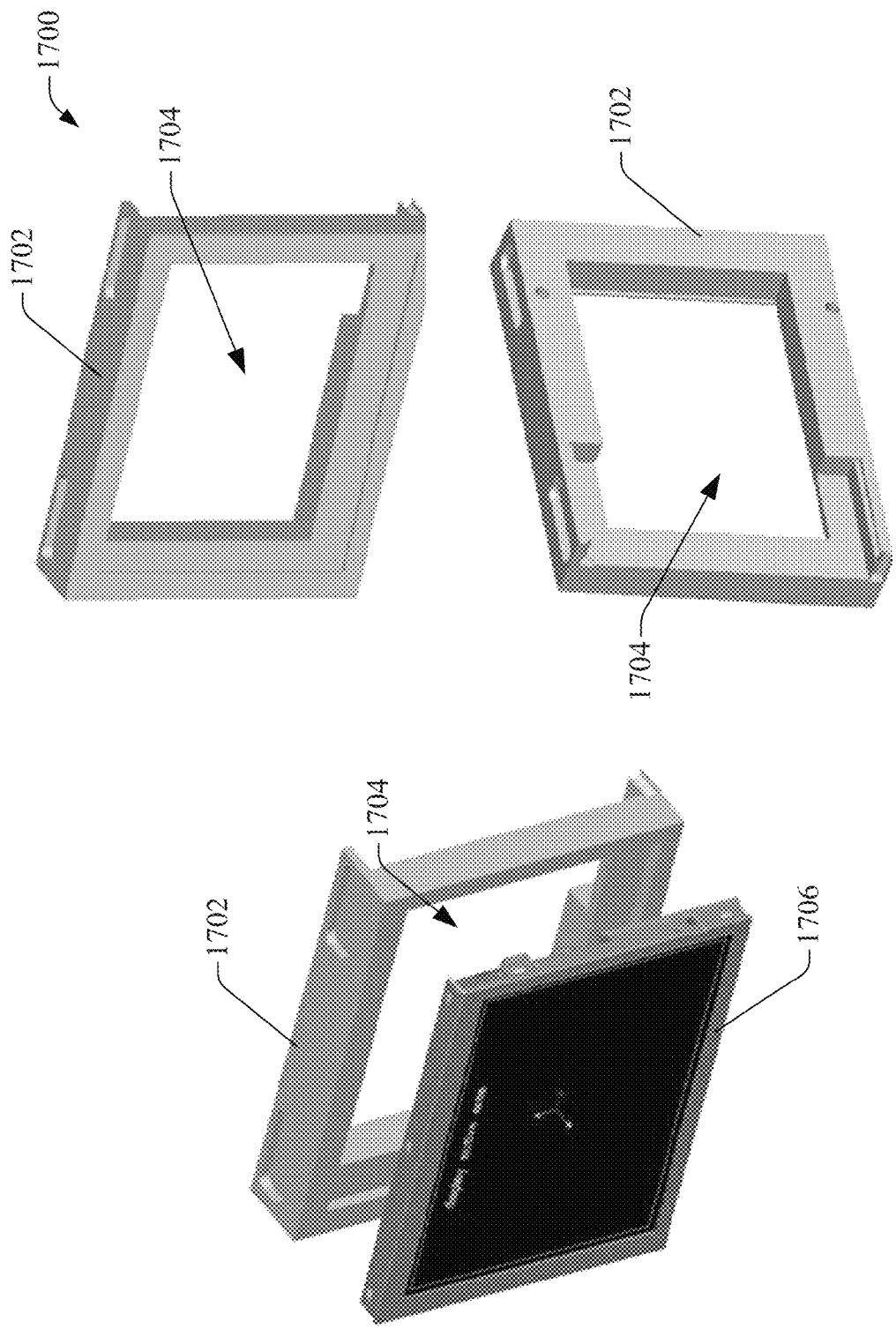
FIGS. 17 and 18 illustrate diagrams of an example system that can employ rubber-boot-mount DRB to facilitate retaining a display in a bezel in accordance with various other aspects and embodiments of the disclosed subject matter.
Figure 18:
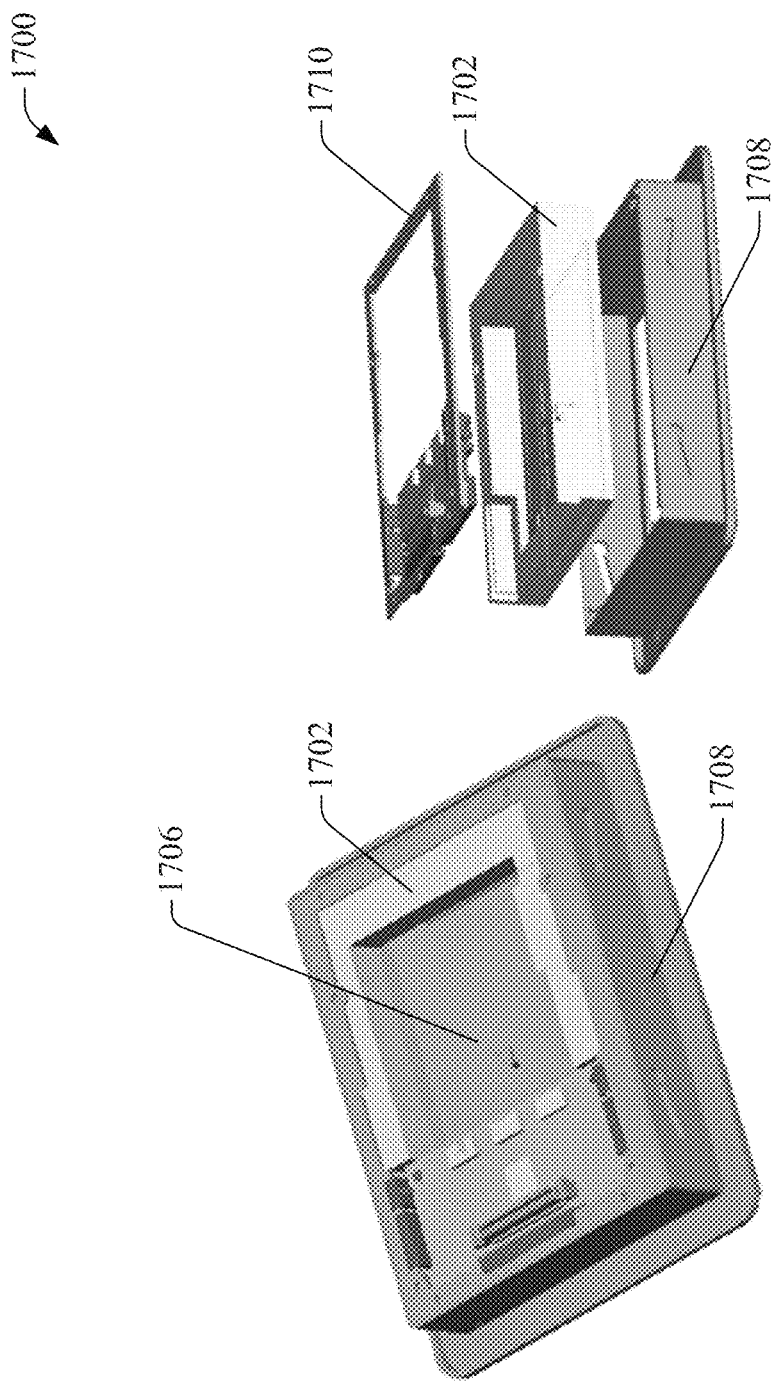

FIGS. 17 and 18 illustrate diagrams of an example system 1700 that can employ rubber-boot-mount DRB to facilitate retaining a display in a bezel in accordance with various other aspects and embodiments of the disclosed subject matter. In an aspect, the system 1700 can include a DRB 1702 that can be formed of a material that has a desired amount of flexibility. For example, the DRB 1702, or at least a portion thereof, can be formed of a polymer-type material, such as rubber or plastic. The DRB 1702 can be shaped to have a frame that defines an inner space 1704 (e.g., inner region) that is large enough in size so that at least a portion of the display 1706 can be contained within the area defined by the inner space 1704 encompassed by the frame of the DRB 1702, wherein the frame of the DRB 1702 can surround the display 1706. The outside of the frame of the DRB 1702 can be sized and shaped to enable the DRB 1702 to be inserted in the housing of a bezel 1708. The display 1706 can be inserted into the inner space 1704, wherein the shape and size of the inner space 1704 can correspond (e.g., same or similar size and shape, or a slightly smaller size, to enable the frame of the DRB 1702 to be stretched around the display housing), or substantially correspond, to the shape and size (e.g., length, width, depth) of the display 1706 to enable the display 1706 (e.g., housing of the display), or portion thereof, to be held within the frame (e.g., within the inner space 1704) of the DRB 1702 due in part to the elastic qualities of the rubber (or plastic), which can allow the frame of the DRB 1702 to be altered in size and shape to be stretched around the display housing and then return from the stretched condition to apply a force to the display housing to retain the display housing within the inner space 1704 of the frame of the DRB 1702. As a result, the DRB 1702 can retain the display 1706 without having to use fasteners (e.g., screws).

In still another aspect, the DRB 1702 and display 1706 can be inserted into the housing of the bezel 1708, as shown in FIG. 18. In an aspect, the height of the DRB 1702 can be high enough such that when the DRB 1702 is placed in the bezel housing the DRB 1702 has an extend portion, which extends beyond the back side of the display 1706, and extends to at or near the edge of the back side of the housing of the bezel 1708, to facilitate enabling the adapter plate 1710 (e.g., backing plate) to come in contact and/or compress the DRB 1702, when the adapter plate 1710 is fastened to the housing of the bezel 1708. The adapter plate 1710 can facilitate holding the DRB 1702 and display 1706 in place within the housing of the bezel 1708. In an aspect, due at least in part to the inherent force absorption properties of the rubber material of the DRB 1702, the DRB 1702 can dampen or reduce vibrations to the display 1706 from forces applied to the bezel sub-assembly. In yet another aspect, the dust gasket can be formed or integrated into the DRB 1702.

Figure 19:
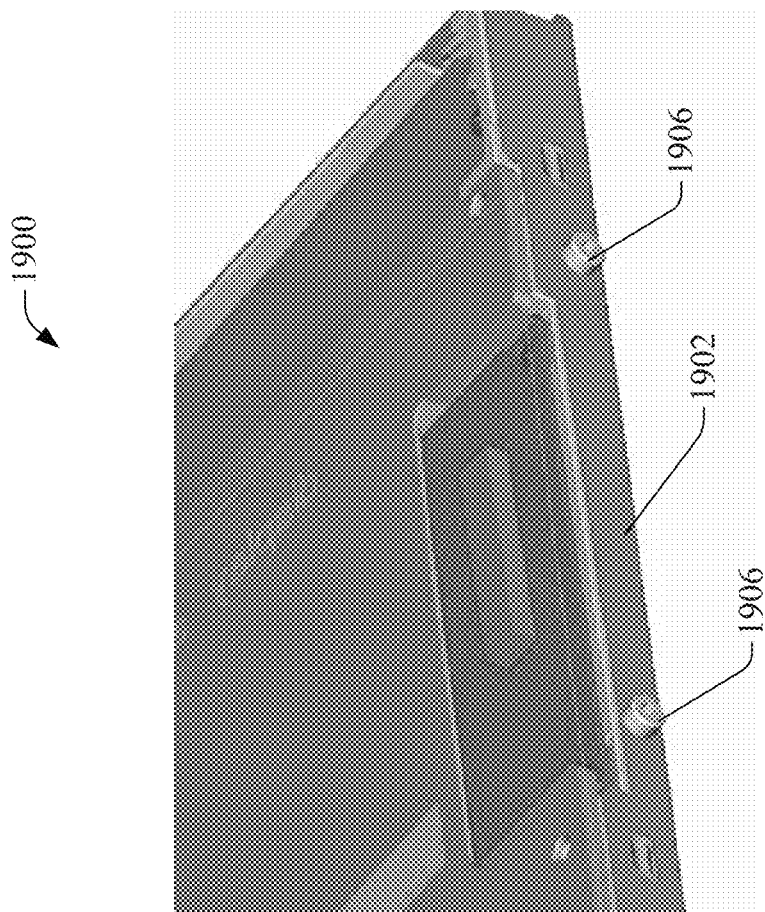
FIG. 19 illustrates a diagram of an example system that can employ side mounting pin for side screw bolt head retention to facilitate desirably retaining a display when the display is placed in a bezel housing in accordance with various aspects and embodiments.
Figure 19:
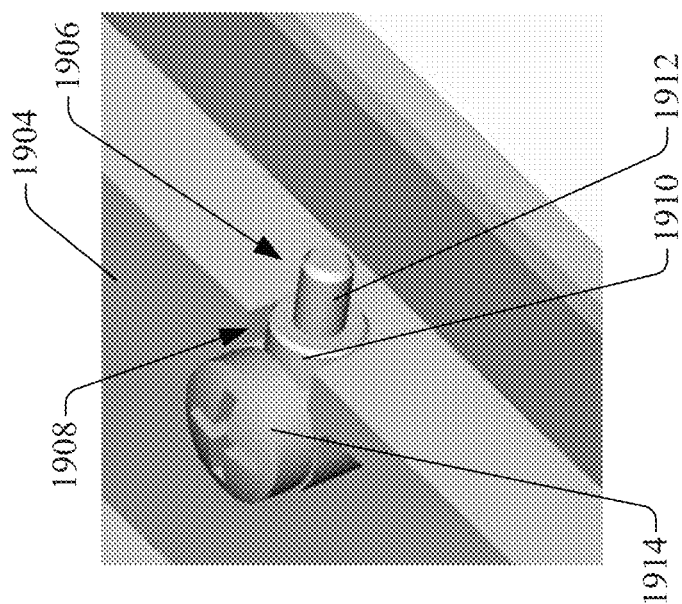

FIG. 19 illustrates a diagram of an example system 1900 that can employ side mounting pin for side screw bolt head retention to facilitate desirably retaining a display when the display is placed in a bezel housing in accordance with various aspects and embodiments. The system 1900 can include a display 1902 (a portion of the display 1902 is shown in FIG. 19) that has holes in the sides of its housing for side mounting (e.g., horizontal mounting) of the display 1902. The system 1900 also can include a bezel 1904 (a portion of the bezel 1904 is shown in FIG. 19), wherein the display 1902 can be inserted in and secured within the housing of the bezel 1904. The display 1902 and bezel 1904 respectively can comprise similar features, as disclosed herein, except that the bezel 1904 can have other features as disclosed herein with regard to the system 1900.

In an aspect, the system 1900 can employ a desired number (e.g., 4) of pins or screws, such as pin 1906, which can be side mounted pins 1906 that can be placed in a desired number (e.g., 4) recessed regions, such as recessed region 1908, formed in locations of the housing of the bezel 1904 that correspond to the locations of the holes in the sides of the display 1902 when the display is inserted into the bezel housing and is in the desired position within the housing of the bezel 1904. The pins 1906 can be constructed of a metal material (e.g., steel), polymer-based material (e.g., plastic, rubber), or other desired material. Typically, the head portion 1910 of the side mounted pin 1906 can be larger in size than the retention portion 1912 of the side mounted pin 1906, wherein the retention portion 1912 can have a size and shape that corresponds or substantially corresponds to the size and shape of the holes in the display housing. The retention portions 1912 of the side mounted pins 1906 can be inserted or slid into the holes (e.g., 2 holes) on the sides (e.g., left side, right side) of the display 1902. The shape and size of the recessed region 1908 can be such that the side mounted pins 1906 can be inserted and can fit into the recessed regions 1908. The display with the side mounted pins 1906 therein can be inserted into the housing of the bezel 1904, wherein the head portions 1910 of the side mounted pins 1906 can be placed in the respective recessed regions 1908 of the housing of the bezel 1904.

In another aspect, a desired number (e.g., 4) retaining fasteners 1914 (e.g., retaining screws) can be inserted into holes formed in the recessed regions 1908 and tightened down to the bezel housing to secure the side mounted pins 1906 in the recessed regions 1908 to thereby retain and secure the display 1902 in the housing of the bezel 1904. For instance, a recessed region 1908 can be large enough in size such that there can be a gap that remains after the side mounted pin 1906 is inserted in the recessed region 1908, wherein the hole for the fastener 1914 can be formed in the vertical direction in the bottom of the recessed region 1908 in the area of the gap. The system 1900 can desirably retain the display 1902 in the housing of the bezel 1904 without having to insert fasteners into the holes in the housing of the display 1902.

Figure 20:
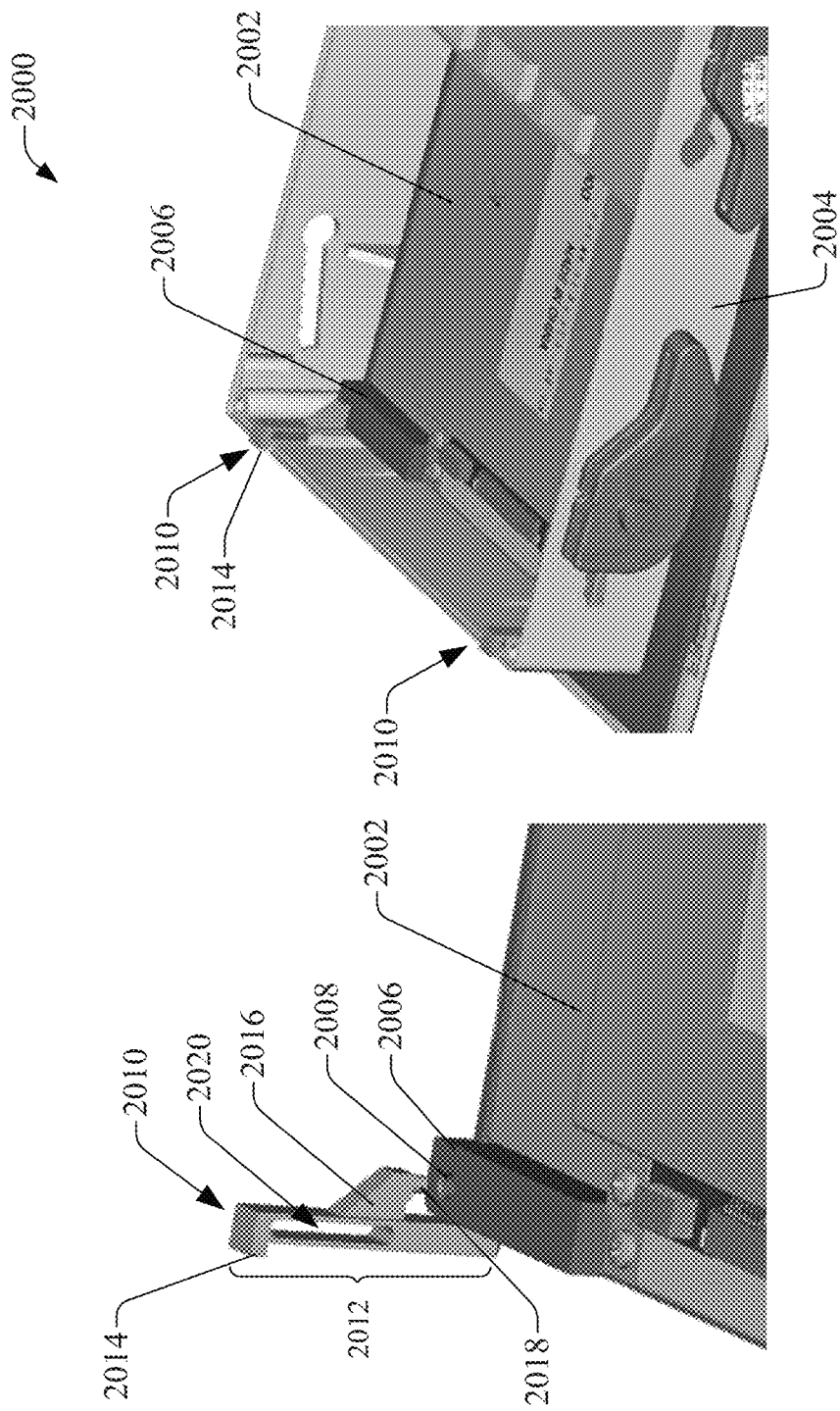
FIG. 20 depicts a diagram of an example system that can employ mounting wedges to desirably secure a display in the housing of a bezel in accordance with various aspects and embodiments of the disclosed subject matter.

FIG. 20 depicts a diagram of an example system 2000 that can employ mounting wedges to desirably secure a display in the housing of a bezel in accordance with various aspects and embodiments of the disclosed subject matter. The system 2000 can include a display 2002 (a portion of the display 2002 is shown in FIG. 20). The system 2000 also can include a bezel 2004 (a portion of the bezel 2004 is shown in FIG. 20), wherein the display 2002 can be inserted in and secured within the housing of the bezel 2004, as more fully disclosed herein.

In an aspect, the system 2000 can include a specified number (e.g., 4) of retention blocks 2006 that can be formed on, placed on, or attached to the back side of the display 2002. For instance, the retention blocks 2006 can be located at or near each of the four corners on the back side of the display 2002. In another aspect, a retention block 2006 can have a hole 2008 having a desired size and shape on its top side. In still another aspect, the system 2000 can include a desired number (e.g., 4) of mounting wedges 2010 that can be used to retain the display 2002 within the housing of the bezel 2004 (2 mounting wedges 2010 are shown in FIG. 20, however, it is to be appreciated and understood that there can be 2 other mounting wedges 2010 associated with the portion of the display 2002 that is not shown in FIG. 20). The mounting wedges 2010 can be formed of polymer-based material (e.g., plastic, rubber), a metal material, or another desired material.

In an aspect, a mounting wedge 2010 can include a main member 2012 (e.g., main frame) that can have a specified length such that, when the mounting wedge 2010 is in the housing of the bezel 2004 and attached to the retention block 2006, the main member 2012 can extend from at or just past the back end of the housing of the bezel 2004 vertically to a point beyond the retention block 2006 (e.g., to the inner surface of the front side of the bezel housing), wherein part of the main member 2012 can be placed against the retention block 2006 when the mounting wedge 2010 is attached to the retention block 2006. In another aspect, the mounting wedge 2010 can include a extended portion 2014 that can extend outward (e.g., towards the outside of the bezel housing) in a horizontal direction from the main member 2012, wherein length of the extended portion 2014 in the horizontal direction can be based at least in part on the thickness of the side wall of the bezel housing on which the extended portion 2014 of the mounting wedge 2010 is going to be placed.

In still another aspect, the mounting wedge 2010 can include a retention portion 2016 that can extend inward (e.g., towards the inside of the bezel housing) in the horizontal direction and can have pin 2018 formed thereon or attached thereto, wherein the pin 2018 can protrude or extend in the vertical direction from the retention portion 2016, and wherein the pin 2018 can have a size and shape such that the pin 2018 can be inserted into the hole in the retention block 2006. For instance, the retention portion 2016 and pin 2018 can together form a display retention component. In an embodiment, the retention portion 2016 can have a top side that is angled in relation to the main member 2012 such that the retention portion 2014 becomes increasingly thicker as the retention portion 2014 proceeds in the vertical direction from the back end towards the front end of the bezel housing, with the pin 2018 formed on the bottom side of the retention portion 2014 in a location that can correspond to the hole 2008 in the retention block 2006 when the mounting wedge 2010 is attached to the retention block 2006.

In yet another aspect, the main member 2012 can have a cutout portion 2020 in the upper region of the main member 2012 in proximity to the extended portion 2014, wherein the cutout portion 2020 and the walls of the main member 2012 surrounding the cutout portion 2020 can facilitate controlling the amount of load applied to the display 2002 and associated dust gasket when the display 2002 is inserted into the housing of the bezel 2004. For instance, the main member 2012, with the cutout portion 2020, can absorb at least part of a load applied to the mounting wedge 2010 by, for example, the back plate (not shown in FIG. 20) when the back plate is attached to the housing of the bezel 2004.

In accordance with various aspects, the display 2002, with the retention blocks 2006 desirably placed on the display 2002, can be inserted into the housing of the bezel 2004. The mounting wedges 2010 can be placed on the retention blocks 2006 by inserting the pins 2018 in the corresponding holes 2008 of the retention blocks 2006, wherein the extended portions 2014 of the mounting wedges 2010 can be placed on the back end (e.g., the top of the side walls) of the housing of the bezel 2004. The back plate or adapter plate can be fastened to the back end of the bezel 2004 using fasteners to secure the display 2002 in the desired position within the housing of the bezel 2004.

The architecture of the system 2000 can enable the display 2002 to be desirably positioned and retained within the housing of the bezel 2004 without having to use fasteners to retain the display 2002 itself (although fasteners are used to attach the back plate to the bezel housing). Further, in an embodiment, the system 2000, by using the mounting wedges 2010 constructed of a polymer-based material and having cutout portion 2020, can dampen vibrations to which the display 2002 may be subjected when the bezel 2004 is subjected to forces, and can desirably control (e.g., reduce or limit) the amount of load applied to the display 2002 and associated dust gasket, while allowing the dust gasket to be maintained in desired compression, when the back plate is fastened to the bezel housing.

Figure 21:
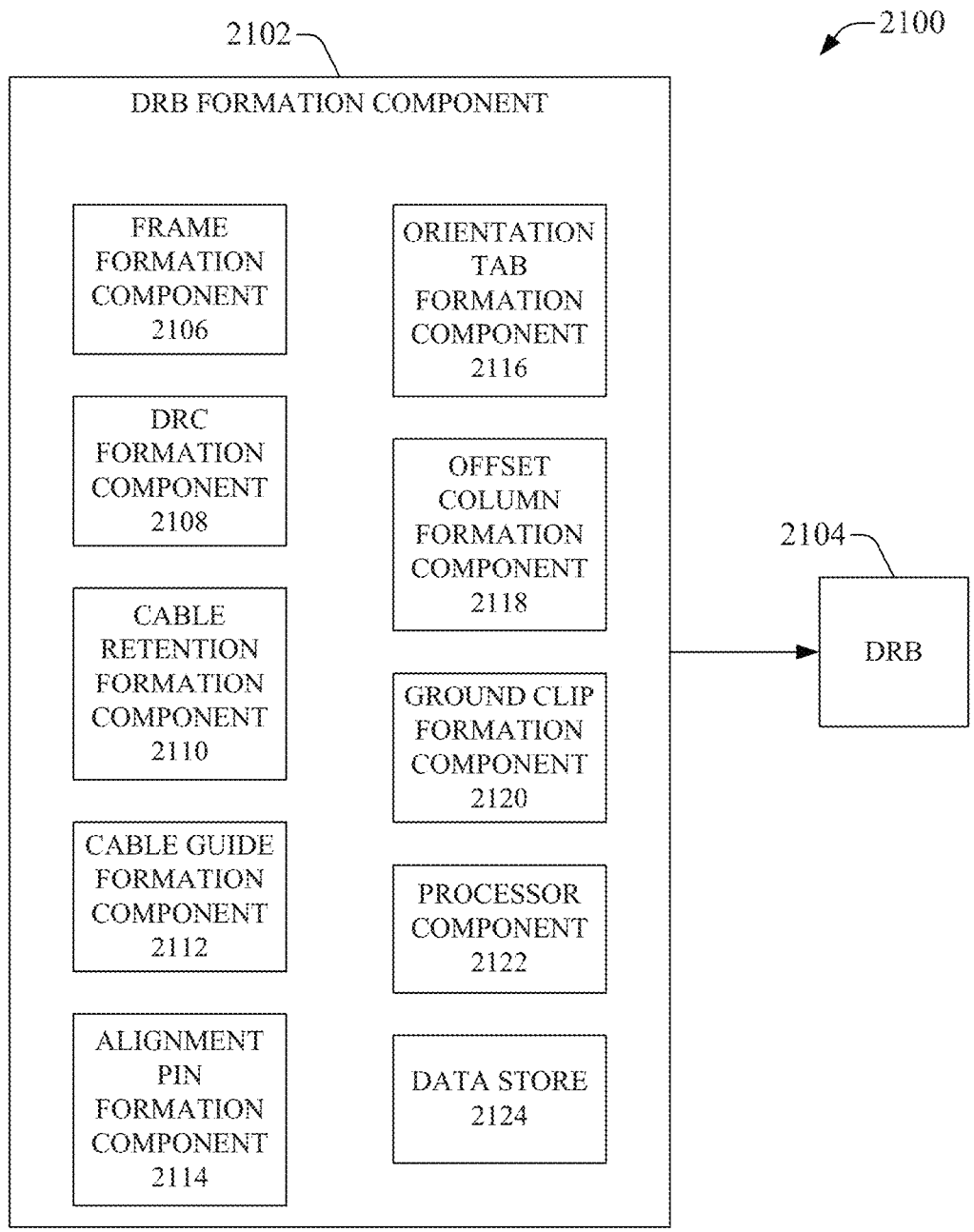
FIG. 21 presents a flowchart of an example method for organizing and presenting folders and screens in accordance with various aspects and embodiments of the disclosed subject matter.

FIG. 21 illustrates a block diagram of an example system 2100 that can be utilized to form a DRB in accordance with various aspects and embodiments of the disclosed subject matter. The system 2100 can include a DRB formation component 2102 that can be employed to form, generate, or produce a DRB 2104. In one embodiment, the DRB formation component 2102 can be part of an injection molding process (e.g., plastic injection molding process) to form the DRB 2104, although, in accordance with other embodiments, other types of processes and/or other types of materials can be employed to form the DRB 2104.

In accordance with an embodiment, the DRB formation component 2102, or a portion thereof, can be employed by, or can be part of, a computer system, such as disclosed herein, for example, with regard to computing environment 1500 of FIG. 15 or computing environment 1600 of FIG. 16, wherein the DRB formation component 2102 also can comprise mechanical components and functions, to facilitate forming the DRB 2104. In accordance with other embodiments, the DRB formation component 2102 can be a stand-alone unit that can comprise computing components and functions, and/or can comprise or be associated with mechanical components and functions, to facilitate forming the DRB 2104.

In one aspect, the DRB formation component 2102 can comprise a frame formation component 2106 that can be employed to form the main frame of the DRB 2104, wherein the main frame can have a specified size and shape, which can be determined based at least in part on the respective sizes and shapes of a display and bezel, so that the DRB 2104 can be attached to the display (e.g., the DRB 2104 can attached such that its inner surface can be placed against the top, bottom, left side, and right side of the display), and the DRB 2104 and associated display can be inserted into the housing of the bezel, as more fully disclosed herein. For example, the DRB formation component 2102 can be configured to form a main frame of a DRB 2104, wherein the main frame can be configured to have a convex quadrilateral shape and a size that can enable a portion of the housing of the display to be inserted into a space defined and surrounded by the main frame wherein the portion of the housing of the display can have a defined size.

In another aspect, the DRB formation component 2102 can include a DRC formation component 2108 that can be utilized to form a specified number of DRCs on the inner surface of the DRB 2104 in respective locations that can correspond to respective locations of holes or receptacles on the outer surface of the display (e.g., on the left side and right side of the display, wherein the DRCs can be inserted into the respective holes on the display, when the DRB 2104 is attached to the display, to retain the display in the horizontal direction without having to use fasteners (e.g., screws, such as micro screws). The DRC formation component 2108 also can form the DRCs to have a shape and size that can correspond to the shape and size of the holes of the display in which the DRCs are to be inserted.

In still another aspect, the DRB formation component 2102 can contain a cable retention formation component 2110 that can form a cable retention component on the DRB 2104 in a specified location of the main frame of the DRB 2104 so that when the DRB 2104 is attached to the display, which can have a cable connector inserted into the cable receptacle of the display, the cable retention component can retain the cable connector (and associated cable wires) within the cable receptacle of the display and resist the pulling out of the cable connector from the cable receptacle when a predefined amount of pull-out force is applied to the cable connector, wherein the specified amount of pull-out force can be in accordance with the predefined DRB construction criteria, which can be based at least in part on industry standards.

In yet another aspect, the DRB formation component 2102 can comprise a cable guide formation component 2112 that can be used to form a cable guide component that includes a specified number of channels wherein cable wires can be inserted and secured, as more fully disclosed herein. The cable guide formation component 2112 can form a specified number of raised lines and/or can form a specified number of grooves (e.g., channels) in the portion of the DRB 2104 that is near the cable receptacle of the display when the DRB 2104 is attached to the display. The cable guide component can secure a specified number of cable wires associated with the display so that the cable wires do not freely move and potentially move to an area where the cable wires can become corrupted by other components or where the cable wires can corrupt other components.

In accordance with an aspect, the DRB formation component 2102 can include an alignment pin formation component 2114 that can be employed to form a specified number of alignment pins at respective locations of the DRB 2104, wherein the alignment pins can be used to facilitate precisely aligning the display with the bezel when the DRB 2104 and associated display are inserted into the bezel, as more fully disclosed herein.

In still another aspect, the DRB formation component 2102 can contain an orientation tab formation component 2116 that can form one or more tabs, such as, for example, one or more non-symmetrical tabs, in desired respective regions of the DRB 2104 that can facilitate insertion of the display in the bezel so that the display has the correct orientation when presenting information on the display screen. The structure of the non-symmetrical tabs can be as more fully disclosed herein.

In another aspect, the DRB formation component 2102 can include an offset column formation component 2118 that can form a specified number of offset columns on respective regions of the DRB 2104, wherein the offset columns can facilitate controlling the amount of load that is applied to components (e.g., display) of the assembly when the adapter plate is fastened onto the bezel to secure the display and associated DRB 2104 in the bezel housing. The offset column formation component 2118 can form the offset columns to have a spring feature or spring-like feature that can allow the offset columns to absorb at least part of the force or load applied to the offset columns when the adapter plate is placed on the offset columns and is fastened to the bezel, wherein the force or load absorption can desirably reduce the amount of force or load on the display.

In yet another aspect, the DRB formation component 2102 can contain a ground clip formation component 2120 that can form a ground clip component, comprising a ground clip, and/or can attach the ground clip component to the DRB 2104 in a desired region of the DRB 2104 to facilitate creating and/or extending a ground path between the bezel and the display when the display and DRB 2104 are inserted into the bezel housing, as more fully disclosed herein. The ground clip can be formed of a desired conductive metal material to facilitate conducting electrically to maintain a desired grounding of the assembly.

In an aspect, the DRB formation component 2102 can comprise a processor component 2122 that can operate in conjunction with the other components (e.g., frame formation component 2102, DRC formation component 2104, cable retention formation component 2106, etc.) of the DRB formation component 2102 to facilitate performing the various functions of the DRB formation component 2102. The processor component 2122 can employ one or more processors, microprocessors, or controllers that can process data, such as information relating to forming a DRB 2104, including its various components and structures, information for controlling communication of data between the DRB formation component 2102 and other components, information relating to other operations of the DRB formation component 2102, and/or other information, etc., to facilitate operation of the DRB formation component 2102, as more fully disclosed herein, and control data flow between the DRB formation component 2102 and other components (e.g., presentation component comprising a display screen, user interface, etc.) associated with the DRB formation component 2102.

The DRB formation component 2102 also can contain a data store 2124 that can store data structures (e.g., user data, code, control data, metadata), code structure(s) (e.g., modules, objects, hashes, classes, procedures) or instructions, information relating to forming a DRB 2104, including its various components and structures, information for controlling communication of data between the DRB formation component 2102 and other components, information relating to other operations of the DRB formation component 2102, etc., to facilitate controlling operations associated with the DRB formation component 2102. In an aspect, the processor component 2122 can be functionally coupled (e.g., through a memory bus) to the data store 2124 in order to store and retrieve information desired to operate and/or confer functionality, at least in part, to the components of the DRB formation component 2102 (e.g., frame formation component 2102, DRC formation component 2104, screen cable retention formation component 2106, etc.), and/or substantially any other operational aspects of the DRB formation component 2102.

Figure 22:
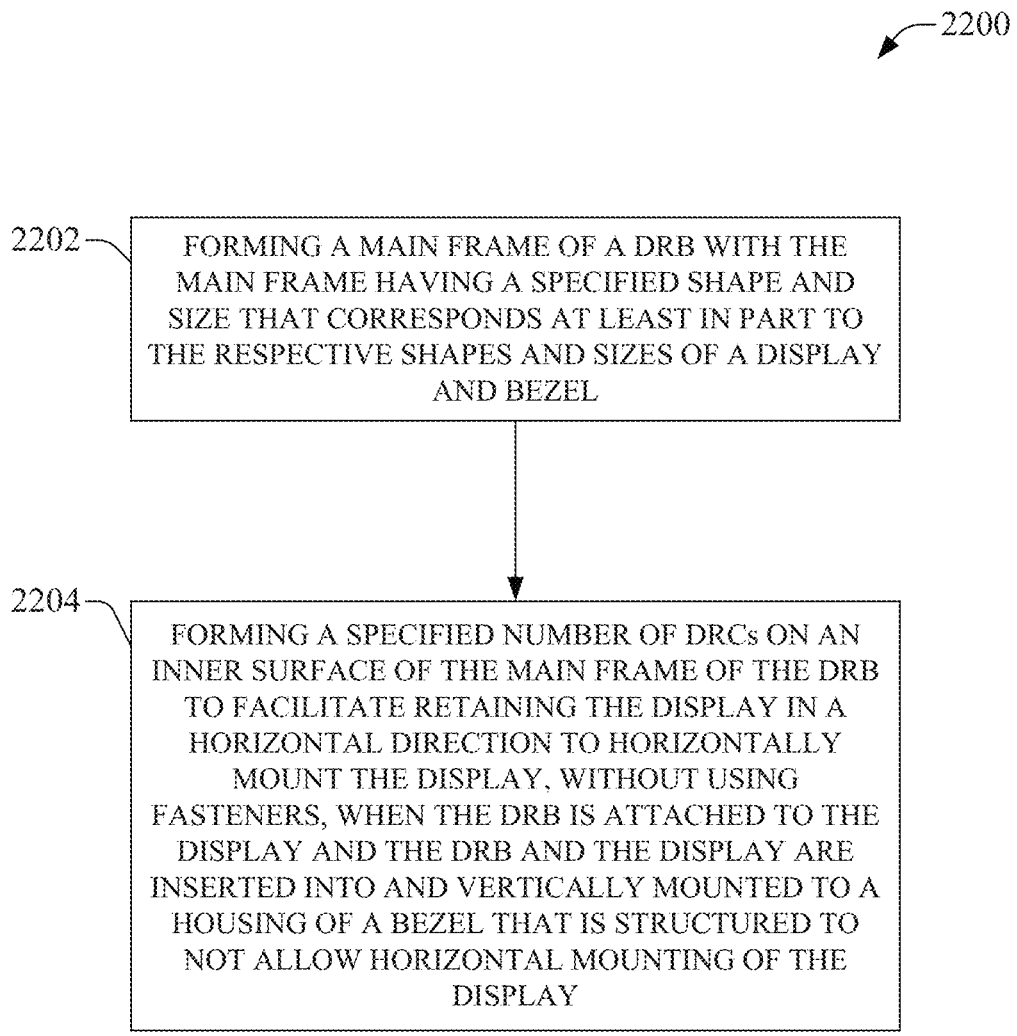
FIG. 22 illustrates a flow diagram of an example method for forming a DRB in accordance with various aspects and embodiments of the disclosed subject matter.
Figure 23:
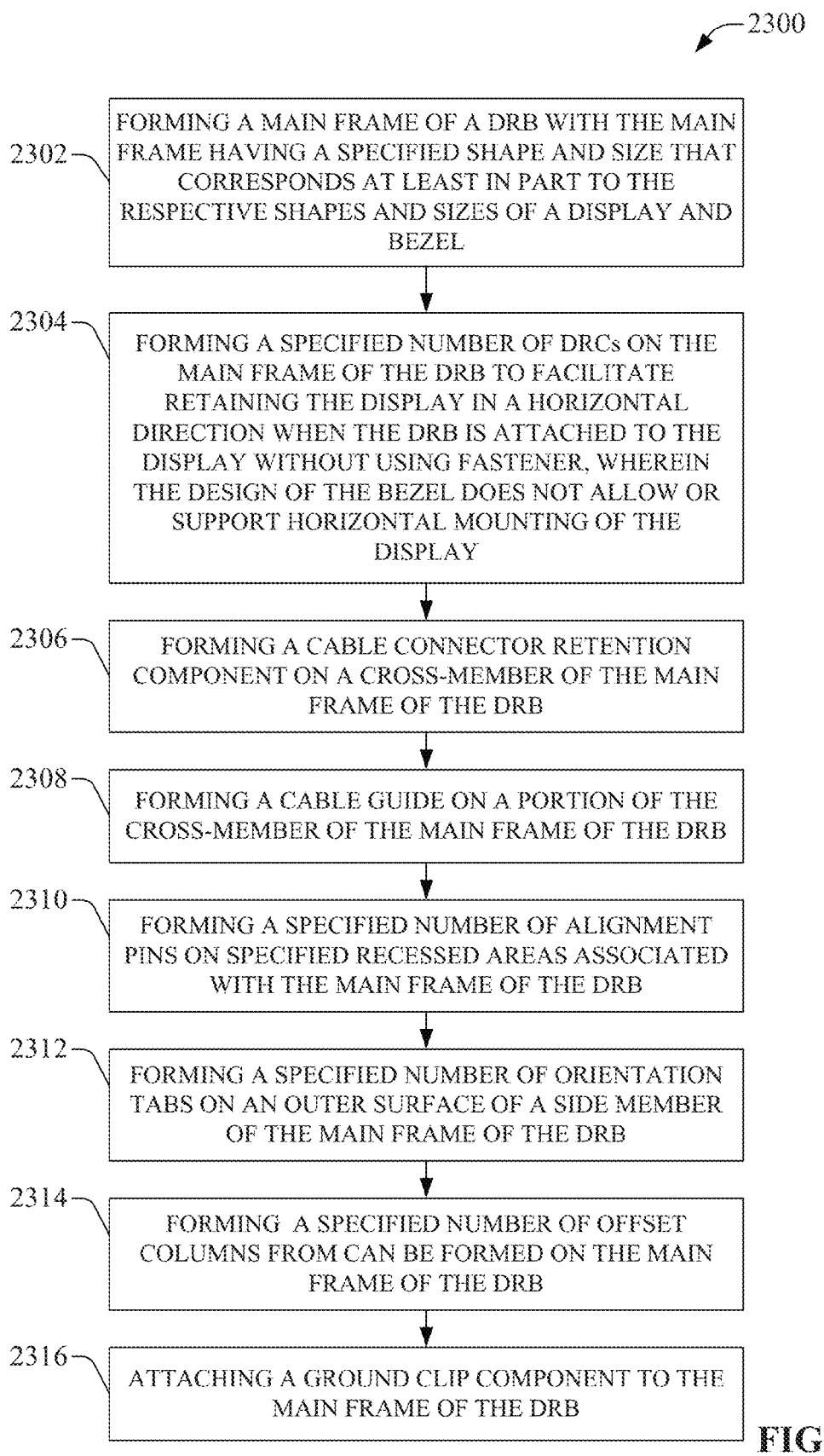
FIG. 23 illustrates a flow diagram of another example method for forming a DRB in accordance with various aspects and embodiments of the disclosed subject matter.
Figure 24:
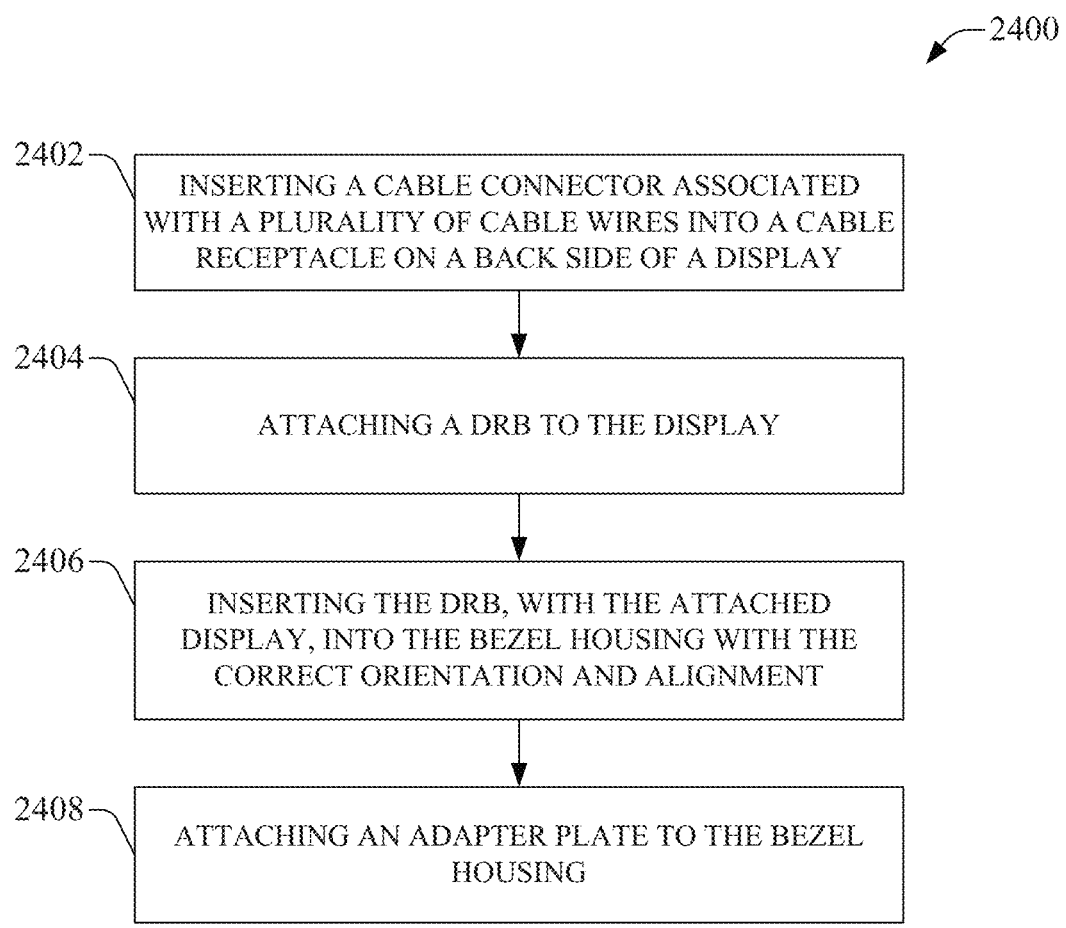
FIG. 24 presents a flow diagram of an example method for mounting a display in a bezel housing a DRB in accordance with aspects of the disclosed subject matter.

In view of the example systems described above, example methods that can be implemented in accordance with the disclosed subject matter can be better appreciated with reference to flowcharts in FIGS. 22-24. For purposes of simplicity of explanation, various methods disclosed herein are presented and described as a series of acts; however, it is to be understood and appreciated that the subject disclosure is not limited by the order of acts, as some acts may occur in different order and/or concurrently with other acts from that shown and described herein. It is noted that not all illustrated acts may be required to implement a described method in accordance with the subject specification. In addition, for example, one or more methods disclosed herein could alternatively be represented as a series of interrelated states or events, such as in a state diagram. Moreover, interaction diagram(s) or call flow(s) represent several of the example methods disclosed herein in accordance with the described subject matter; particularly in instances when disparate entities, or functional elements, enact disparate portions of one or more of the several methods. Furthermore, two or more of the disclosed example methods can be implemented in combination, to accomplish one or more features or advantages described in the subject disclosure.

FIG. 22 is a flowchart of an example method 2200 for forming a DRB in accordance with various aspects and embodiments of the disclosed subject matter. At 2202, a main frame of a DRB can be formed with the main frame having a specified shape (e.g., polygonal, quadrilateral (e.g., convex quadrilateral), square, rectangular, circular, elliptical, etc.) and size that can correspond at least in part to the respective shapes and sizes of a display and bezel. For instance, the inside surface of the main frame of the DRB can be structured such that the DRB can be attached onto the outer surface of the display, wherein at least a portion of the display housing can be within the main frame of the DRB when the DRB is attached to the display. In another aspect, the main frame of the DRB can be shaped and sized on its outer surface such that the DRB, with the associated display, can be inserted into the bezel housing and the assembly can be fastened using an adapter plate and fasteners. For example, the main frame of the DRB can be formed to have a polygonal or substantially polygonal shape and a specified size, wherein the main frame is large enough to contain at least a portion of a display within an area defined and surrounded by the main frame, wherein the portion of the display has a defined size.

At 2204, a specified number of DRCs can be formed on an inner surface of the main frame of the DRB to facilitate retaining the display in a horizontal direction to horizontally mount the display, without using fasteners (e.g., screws), when the DRB is attached to the display and the DRB and the display are inserted into and vertically mounted to a housing of a bezel that is structured to not allow horizontal mounting of the display. In an aspect, the DRCs can be formed on the inner surface of the main frame in respective locations that can correspond to the locations of a specified number of holes formed in the outer surface of the housing of the display. When the DRB is attached to the display, the respective DRCs can be inserted into the respective holes on the display housing, and the DRCs can retain the display in a horizontal direction without using fasteners. The retaining of the display in the horizontal direction by the DRB can facilitate proper alignment of the display in relation to the bezel. The DRB and associated display can be placed within the bezel housing, and the adapter plate can be placed on the DRB and bezel, and fastened to the bezel housing.

FIG. 23 presents a flowchart of example method 2300 for forming a DRB in accordance with various aspects and embodiments of the disclosed subject matter. At 2302, a main frame of a DRB can be formed with the main frame having a specified shape and size that corresponds at least in part to the respective shapes and sizes of a display and bezel. At 2304, a specified number of DRCs can be formed on the main frame of the DRB to facilitate retaining the display in a horizontal direction (e.g., display can be horizontally mounted) when the DRB is attached to the display without using fasteners, even when the design of the bezel does not allow or support horizontal mounting of the display. The acts 2302 and 2304 can be the same or similar as, for example, acts 2202 and 2204, respectively, of method 2200 and/or as otherwise disclosed herein.

At 2306, a cable connector retention component can be formed on a cross-member of the main frame of the DRB. In an aspect, the cable connector retention component can be a vertical post or member that extends downward from the cross-member of the main frame towards the back side of the display housing. In another aspect, the location of the cable connector retention component can be in a region of the cross-member that is at or near the location of a cable connector of a cable when the cable connector is plugged into the cable receptacle located on the back side of the display housing such that the cable connector retention component can be placed against, or substantially close to, the back side of the cable connector when the cable connector is plugged into the cable receptacle and the DRB is attached to the display. In still another aspect, the cable connector retention component can be structured to provide a specified amount of resistance that can prevent or resist the pulling out of the cable connector when a specified amount of pull-out force is applied to the cable connector to attempt to disengage the cable connector from the cable receptacle, in accordance with predefined DRB construction criteria.

At 2308, a cable guide can be formed on a portion of the cross-member of the main frame of the DRB. In an aspect, the cable guide can comprise a specified number of ribs separated from each other by a specified distance(s) to form one or more channels in which cable wires can be placed to facilitate securing the cable wires, as more fully disclosed herein. Based at least in part on the size (e.g., width or diameter) of the respective cable wires, the one or more channels can have the same size (e.g., same width or depth, or can have different sizes (e.g., different widths or depths).

At 2310, a specified number of alignment pins can be formed on specified recessed areas associated with the main frame of the DRB. In an aspect, the alignment pins can be respectively located on the main frame (e.g., on recessed pin bases on the main frame extending out from side members (e.g., left side member, right side member) of the main frame). The respective locations of the alignment pins can correspond to respective holes in the bezel housing, and the alignment pins can be inserted into the respective holes in the bezel housing to facilitate aligning the display in relation to the bezel.

At 2312, a specified number of orientation tabs can be formed on an outer surface of a side member of the main frame of the DRB. For example, the orientation tabs can be formed on the bottom side member of the main frame of the DRB to facilitate inserting the display and DRB into the bezel housing with the correct orientation during assembly. In an embodiment, the orientation tabs can be non-symmetrical tabs, wherein the non-symmetry of such tabs can prevent incorrect insertion of the DRB and associated display into the bezel with an incorrect orientation or at least can provide an indication that the DRB and associated display have been incorrectly inserted into the bezel resulting in an incorrect orientation of the display to facilitate correction of the incorrect orientation (e.g., an assembly worker or assembly component can identify that the display has been inserted into the bezel with an incorrect orientation based at least in part on a visual or structural indicator from perceiving the non-symmetrical tabs in relation to the bezel housing).

At 2314, a specified number of offset columns from can be formed on the main frame of the DRB. The offset columns can be formed to extend upward in a vertical direction opposite from the display and in the direction of the adapter plate that can be inserted onto the offset columns. The offset columns can comprise a spring feature, or a spring-like feature, that enables an offset column to move or rotate about an axis associated with the attached portion of the base of the offset column, wherein the other side of the offset column can be unattached and free to move up to a specified distance, when desired, until the unattached side of the offset column comes in contact with a member of the main frame of the DRB. The offset columns can facilitate offsetting the forces or loads placed on the assembly in general, and the display in particular, due in part to the fastening of the adapter plate to the bezel, as more fully disclosed herein.

At 2316, a ground clip component can be attached to the main frame of the DRB. In an aspect, a ground clip component, comprising a ground clip, which can be formed of a desired conductive metal material, can be attached to or inserted into a portion of a desired member of the main frame. The ground clip can be used to facilitate extending a ground path from the bezel to the display, as more fully disclosed herein.

FIG. 24 is a flowchart of an example method 2400 for mounting a display in a bezel housing a DRB in accordance with aspects of the disclosed subject matter. At 2402, a cable connector associated with a plurality of cable wires can be inserted into a cable receptacle on a back side of a display.

At 2404, a DRB can be attached to the display. In an aspect, the DRB can be formed of a semi-rigid polymer material that can be flexible enough to enable the display to be inserted into and attached to the frame of the DRB, and further enable the DRCs to be inserted into the holes on the display housing, yet rigid enough to support the display and retain the display in the horizontal direction to horizontally mount the display without using fasteners, even though the bezel housing does not allow for horizontal mounting of the display. The DRB can be attached to the display such that the back side of the display can be within the frame of the DRB, and the cable connector can be sufficiently retained in the cable receptacle by the cable connector retention component. In another aspect, the cable wires can be inserted into or routed via the cable guide component, which can secure the cable wires, as more fully disclosed herein At 2406, the DRB, with the attached display, can be inserted into the bezel housing with the correct orientation and alignment. In an aspect, the non-symmetrical tabs of the orientation component of the DRB can facilitate inserting the DRB and display into the bezel housing with the correct orientation. In another aspect, the alignment pins of the DRB can be inserted into the corresponding holes in the bezel housing to facilitate properly (e.g., precisely) aligning the display within the bezel housing.

At 2408, an adapter plate can be attached to the bezel housing. In an aspect, the adapter plate can be placed on the offset columns of the DRB and the back of the bezel housing, wherein the existing portion of the back side of the bezel housing can comprise a specified number of holes in which fasteners (e.g., screws) can be inserted to fasten the adapter plate to the bezel housing and secure the display within the bezel housing. The offset columns can offset, distribute, or absorb at least part of the force or load caused by the attaching of the adapter plate to the bezel housing the fasteners, as more fully disclosed herein.

One or more methods disclosed throughout the subject specification and annexed drawings are capable of being stored on an article of manufacture to facilitate transporting and transferring such method(s) to computers or chipsets with processing capability(ies) for execution, and thus implementation, by a processor, or for storage in a memory. In an aspect, one or more processors that enact method(s) described herein can be employed to execute computer-executable code instructions retained in a memory, or any computer-readable or machine-readable medium, to implement method(s) described herein; the code instructions, when executed by the one or more processor implement or carry out the various acts in the method(s) described herein. The computer-executable code instructions provide a computer-executable or machine-executable framework to enact, or implement, the method(s) described herein.

Figure 25:
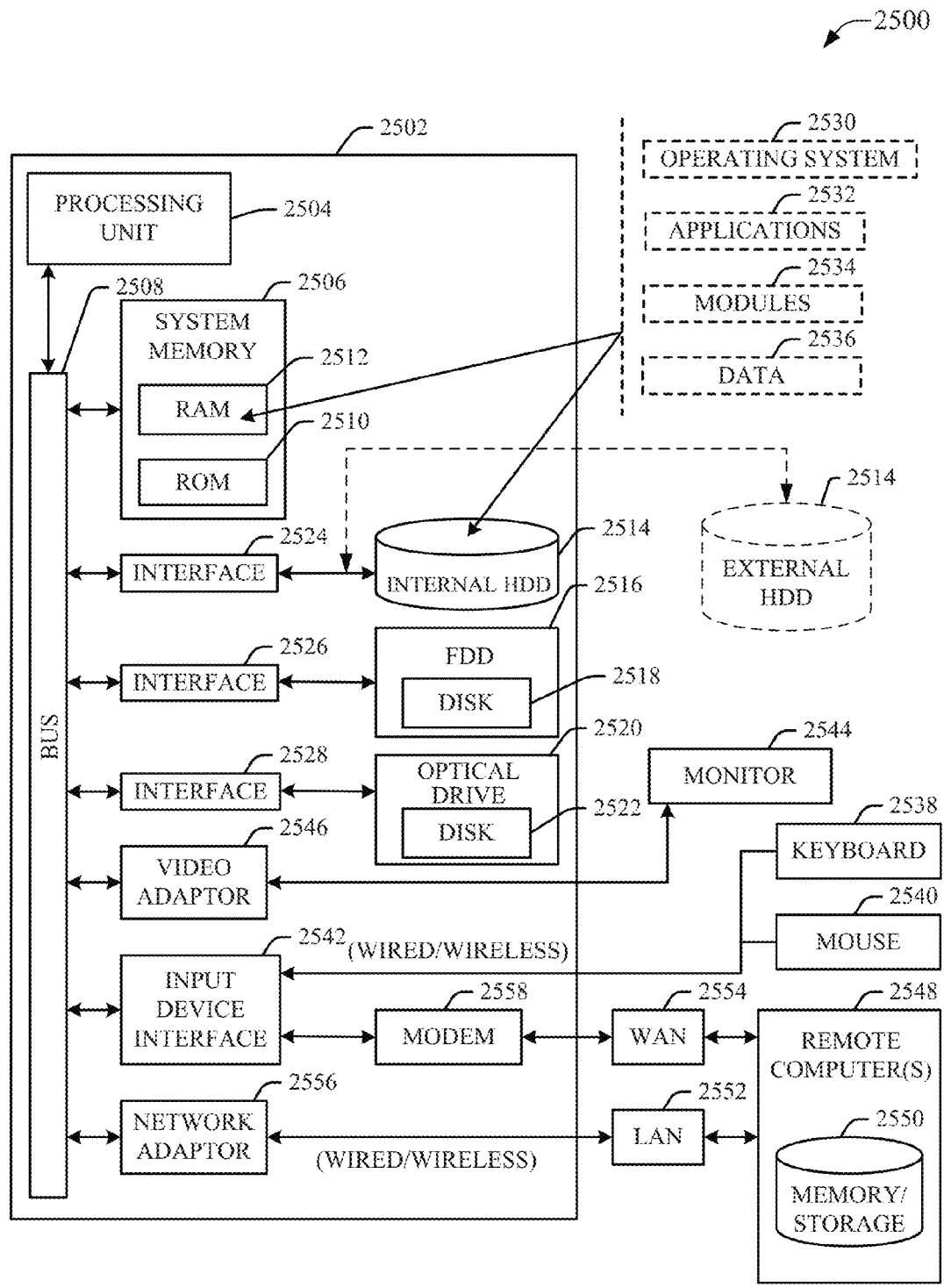
FIG. 25 depicts a block diagram of a computer operable to execute the disclosed architecture.

Referring now to FIG. 25, there is illustrated a block diagram of a computer operable to execute the disclosed architecture. In order to provide additional context for various aspects thereof, FIG. 25 and the following discussion are intended to provide a brief, general description of a suitable computing environment 2500 in which the various aspects of the disclosed subject matter can be implemented. While the description above is in the general context of computer-executable instructions that may run on one or more computers, those skilled in the art will recognize that the disclosed subject matter also can be implemented in combination with other program modules and/or as a combination of hardware and software.

Generally, program modules include routines, programs, components, data structures, etc., that perform particular tasks or implement particular abstract data types. Moreover, those skilled in the art will appreciate that the inventive methods can be practiced with other computer system configurations, including single-processor or multiprocessor computer systems, minicomputers, mainframe computers, as well as personal computers, hand-held computing devices, microprocessor-based or programmable consumer electronics, and the like, each of which can be operatively coupled to one or more associated devices.

The illustrated aspects of the disclosed subject matter also can be practiced in distributed computing environments where certain tasks are performed by remote processing devices that are linked through a communications network. In a distributed computing environment, program modules can be located in both local and remote memory storage devices.

A computer typically includes a variety of computer-readable media. Computer-readable media can be any available media that can be accessed by the computer and includes both volatile and non-volatile media, removable and non-removable media. By way of example, and not limitation, computer-readable media can comprise computer storage media and communication media. Computer storage media includes both volatile and non-volatile, removable and non-removable media implemented in any method or technology for storage of information such as computer-readable instructions, data structures, program modules or other data. Computer storage media includes, but is not limited to, RAM, ROM, EEPROM, flash memory or other memory technology, CD-ROM, digital video disk (DVD) or other optical disk storage, magnetic cassettes, magnetic tape, magnetic disk storage or other magnetic storage devices, or any other medium which can be used to store the desired information and which can be accessed by the computer.

A computer and computing devices in general typically include a variety of media, which can include computer-readable storage media and/or communications media, which two terms are used herein differently from one another as follows. Computer-readable storage media can be any available storage media that can be accessed by the computer and includes both volatile and nonvolatile media, removable and non-removable media. By way of example, and not limitation, computer-readable storage media can be implemented in connection with any method or technology for storage of information such as computer-readable instructions, program modules, structured data, or unstructured data. Computer-readable storage media can include, but are not limited to, RAM, ROM, EEPROM, flash memory or other memory technology, CD-ROM, digital versatile disk (DVD) or other optical disk storage, magnetic cassettes, magnetic tape, magnetic disk storage or other magnetic storage devices, or other tangible and/or non-transitory media which can be used to store desired information. Computer-readable storage media can be accessed by one or more local or remote computing devices, e.g., via access requests, queries or other data retrieval protocols, for a variety of operations with respect to the information stored by the medium.

Communications media typically embody computer-readable instructions, data structures, program modules or other structured or unstructured data in a data signal such as a modulated data signal, e.g., a carrier wave or other transport mechanism, and includes any information delivery or transport media. The term "modulated data signal" or signals refers to a signal that has one or more of its characteristics set or changed in such a manner as to encode information in one or more signals. By way of example, and not limitation, communication media include wired media, such as a wired network or direct-wired connection, and wireless media such as acoustic, RF, infrared and other wireless media.

With reference again to FIG. 25, the example environment 2500 for implementing various aspects includes a computer 2502, the computer 2502 including a processing unit 2504, a system memory 2506 and a system bus 2508. The system bus 2508 couples system components including, but not limited to, the system memory 2506 to the processing unit 2504. The processing unit 2504 can be any of various commercially available processors. Dual microprocessors and other multi-processor architectures may also be employed as the processing unit 2504.

The system bus 2508 can be any of several types of bus structure that may further interconnect to a memory bus (with or without a memory controller), a peripheral bus, and a local bus using any of a variety of commercially available bus architectures. The system memory 2506 includes read-only memory (ROM) 2510 and random access memory (RAM) 2512. A basic input/output system (BIOS) is stored in a non-volatile memory 2510 such as ROM, EPROM, EEPROM, which BIOS contains the basic routines that help to transfer information between elements within the computer 2502, such as during start-up. The RAM 2512 can also include a high-speed RAM such as static RAM for caching data.

The computer 2502 further includes an internal hard disk drive (HDD) 2514 (e.g., EIDE, SATA), which internal hard disk drive 2514 may also be configured for external use in a suitable chassis (not shown), a magnetic floppy disk drive (FDD) 2516, (e.g., to read from or write to a removable diskette 2518) and an optical disk drive 2520, (e.g., reading a CD-ROM disk 2522 or, to read from or write to other high capacity optical media such as the DVD). The hard disk drive 2514, magnetic disk drive 2516 and optical disk drive 2520 can be connected to the system bus 2508 by a hard disk drive interface 2524, a magnetic disk drive interface 2526 and an optical drive interface 2528, respectively. The interface 2524 for external drive implementations includes at least one or both of Universal Serial Bus (USB) and IEEE 1394 interface technologies. Interface 2524 enables functional coupling of computer 2502 to a removable memory, such as a USB memory device or a SD memory card. Other external drive connection technologies are within contemplation of the disclosed subject matter.

The drives and their associated computer-readable media provide nonvolatile storage of data, data structures, computer-executable instructions, and so forth. For the computer 2502, the drives and media accommodate the storage of any data in a suitable digital format. Although the description of computer-readable media above refers to a HDD, a removable magnetic diskette, and a removable optical media such as a CD or DVD, it should be appreciated by those skilled in the art that other types of media which are readable by a computer, such as zip drives, magnetic cassettes, flash memory cards, cartridges, and the like, may also be used in the example operating environment, and further, that any such media may contain computer-executable instructions for performing the methods of the disclosed subject matter.

A number of program modules can be stored in the drives and RAM 2512, including an operating system 2530, one or more application programs 2532, other program modules 2534 and program data 2536. All or portions of the operating system, applications, modules, and/or data can also be cached in the RAM 2512. It is to be appreciated that the disclosed subject matter can be implemented with various commercially available operating systems or combinations of operating systems.

A user can enter commands and information into the computer 2502 through one or more wired/wireless input devices, e.g., a keyboard 2538 and a pointing device, such as a mouse 2540. Other input devices (not shown) may include a microphone, an IR remote control, a joystick, a game pad, a stylus pen, touch screen, or the like. These and other input devices are often connected to the processing unit 2504 through an input device interface 2542 that is coupled to the system bus 2508, but can be connected by other interfaces, such as a parallel port, an IEEE 1394 serial port, a game port, a USB port, an IR interface, etc.

A monitor 2544 or other type of display device is also connected to the system bus 2508 via an interface, such as a video adapter 2546. In addition to the monitor 2544, a computer typically includes other peripheral output devices (not shown), such as speakers, printers, etc.

The computer 2502 may operate in a networked environment using logical connections via wired and/or wireless communications to one or more remote computers, such as a remote computer(s) 2548. The remote computer(s) 2548 can be a workstation, a server computer, a router, a personal computer, portable computer, microprocessor-based entertainment appliance, a peer device or other common network node, and typically includes many or all of the elements described relative to the computer 2502, although, for purposes of brevity, only a memory/storage device 2550 is illustrated. The logical connections depicted include wired/wireless connectivity to a local area network (LAN) 2552 and/or larger networks, e.g., a wide area network (WAN) 2554. Such LAN and WAN networking environments are commonplace in offices and companies, and facilitate enterprise-wide computer networks, such as intranets, all of which may connect to a global communications network, e.g., the Internet.

When used in a LAN networking environment, the computer 2502 is connected to the local network 2552 through a wired and/or wireless communication network interface or adapter 2556. The adaptor 2556 may facilitate wired or wireless communication to the LAN 2552, which may also include a wireless access point disposed thereon for communicating with the wireless adaptor 2556.

When used in a WAN networking environment, the computer 2502 can include a modem 2558, or is connected to a communications server on the WAN 2554, or has other means for establishing communications over the WAN 2554, such as by way of the Internet. The modem 2558, which can be internal or external and a wired or wireless device, is connected to the system bus 2508 via the serial port interface 2542. In a networked environment, program modules depicted relative to the computer 2502, or portions thereof, can be stored in the remote memory/storage device 2550. It will be appreciated that the network connections shown are illustrative and other means of establishing a communications link between the computers can be used.

The computer 2502 is operable to communicate with any wireless devices or entities operatively disposed in wireless communication, e.g., a printer, scanner, desktop and/or portable computer, portable data assistant, communications satellite, any piece of equipment or location associated with a wirelessly detectable tag (e.g., a kiosk, news stand, restroom), and telephone. This includes at least Wi-Fi and Bluetooth™ wireless technologies. Thus, the communication can be a predefined structure as with a conventional network or simply an ad hoc communication between at least two devices.

Wi-Fi, or Wireless Fidelity, allows connection to the Internet from a couch at home, a bed in a hotel room, or a conference room at work, without wires. Wi-Fi is a wireless technology similar to that used in a cell phone that enables such devices, e.g., computers, to send and receive data indoors and out; anywhere within the range of a base station. Wi-Fi networks use radio technologies called IEEE 802.11(a, b, g, etc.) to provide secure, reliable, fast wireless connectivity. A Wi-Fi network can be used to connect computers to each other, to the Internet, and to wired networks (which use IEEE 802.3 or Ethernet). Wi-Fi networks operate in the unlicensed 2.4 and 5 GHz radio bands, at an 11 Mbps (802.11a) or 54 Mbps (802.11b) data rate, for example, or with products that contain both bands (dual band), so the networks can provide real-world performance similar to the basic 10BaseT wired Ethernet networks used in many offices.

Figure 26:
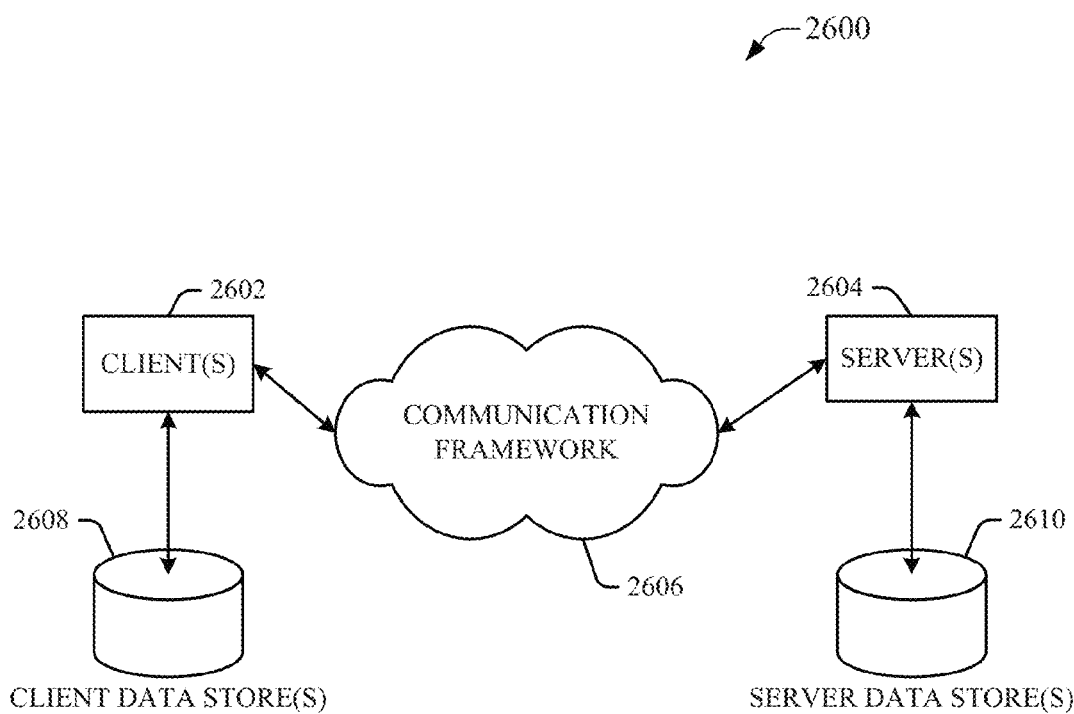
FIG. 26 illustrates a schematic block diagram of an example computing environment.

Referring now to FIG. 26, there is illustrated a schematic block diagram of an example computing environment 2600 in accordance with another aspect. The system 2600 includes one or more client(s) 2602. The client(s) 2602 can be hardware and/or software (e.g., threads, processes, computing devices). The client(s) 2602 can house cookie(s) and/or associated contextual information by employing the disclosed subject matter, for example.

The system 2600 also includes one or more server(s) 2604. The server(s) 2604 can also be hardware and/or software (e.g., threads, processes, computing devices). The servers 2604 can house threads to perform transformations by employing the invention, for example. One possible communication between a client 2602 and a server 2604 can be in the form of a data packet adapted to be transmitted between two or more computer processes. The data packet may include a cookie and/or associated contextual information, for example. The system 2600 includes a communication framework 2606 (e.g., a global communication network such as the Internet) that can be employed to facilitate communications between the client(s) 2602 and the server(s) 2604.

Communications can be facilitated via a wired (including optical fiber) and/or wireless technology. The client(s) 2602 are operatively connected to one or more client data store(s) 2608 that can be employed to store information local to the client(s) 2602 (e.g., cookie(s) or associated contextual information). Similarly, the server(s) 2604 are operatively connected to one or more server data store(s) 2610 that can be employed to store information local to the servers 2604.

In the subject specification and annexed drawings, terms such as "repository," "store," "data store," data storage," and substantially any term(s) that convey other information storage component(s) relevant to operation and functionality of a functional element or component described herein, refer to "memory components," or entities embodied in a "memory" or components comprising the memory. The memory components described herein can be either volatile memory or nonvolatile memory, or can include both volatile and non-volatile memory. In addition, the memory components described herein can be statically affixed (screwed, bolted, soldered, etc.) or removably affixed. Further, the memory components can include computer-readable or machine-readable storage media.

By way of illustration, and not limitation, nonvolatile memory can include read only memory (ROM), programmable ROM (PROM), electrically programmable ROM (EPROM), electrically erasable ROM (EEPROM), or flash memory. Volatile memory can include random access memory (RAM), which acts as external cache memory. By way of further illustration and not limitation, RAM can be available in many forms such as synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), and direct Rambus RAM (DRRAM). Additionally, the disclosed memory components of systems or methods herein are intended to comprise, without being limited to comprising, these and any other suitable types of memory.

The various illustrative logics, logical blocks, modules, and circuits described in connection with the embodiments disclosed herein may be implemented or performed with a general purpose processor, a digital signal processor (DSP), an application specific integrated circuit (ASIC), a field programmable gate array (FPGA) or other programmable logic device (e.g., a PAC), discrete gate or transistor logic, discrete hardware components, or any combination thereof designed to perform the functions described herein. A general-purpose processor may be a microprocessor, but, in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration. Additionally, at least one processor may comprise one or more modules operable to perform one or more of the steps and/or actions described above.

Further, the steps or acts of a method or algorithm described in connection with the aspects disclosed herein may be embodied directly in hardware, in a software module executed by a processor, or in a combination of the two. A software module may reside in RAM memory, flash memory, ROM memory, EPROM memory, EEPROM memory, registers, a hard disk, a removable disk, a CD-ROM, or any other form of storage medium known in the art. An example storage medium may be coupled to the processor, such that the processor can read information from, and write information to, the storage medium. In the alternative, the storage medium may be integral to the processor. Further, in some aspects, the processor and the storage medium may reside in an ASIC. Additionally, the ASIC may reside in a user terminal. In the alternative, the processor and the storage medium may reside as discrete components in a user terminal. Additionally, in some aspects, the steps and/or actions of a method or algorithm may reside as one or any combination or set of codes and/or instructions on a machine readable medium and/or computer readable medium, which may be incorporated into a computer program product.

In one or more aspects, the functions described may be implemented in hardware, software, firmware, or any combination thereof. If implemented in software, the functions may be stored or transmitted as one or more instructions or code on a computer-readable medium. Computer-readable media includes both computer storage media and communication media including any medium that facilitates transfer of a computer program from one place to another. A storage medium may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection may be termed a computer-readable medium. For example, if software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs usually reproduce data optically with lasers. Combinations of the above should also be included within the scope of computer-readable media.

What has been described above includes examples of the disclosed subject matter. It is, of course, not possible to describe every conceivable combination of components and/or methods, but one of ordinary skill in the art may recognize that many further combinations and permutations are possible. Accordingly, the disclosed subject matter is intended to embrace all such alterations, modifications and variations that fall within the spirit and scope of the appended claims. Furthermore, to the extent that the term "includes" is used in either the detailed description or the claims, such term is intended to be inclusive in a manner similar to the term "comprising" as "comprising" is interpreted when employed as a transitional word in a claim.

What is claimed is:

1. A display retention bracket, comprising:
   a main frame configured to have a perimeter that has a shape and a size that is proportional to a housing of a display device to enable a portion of the housing of the display device to be inserted into a space defined and surrounded by the main frame, wherein the portion of the housing of the display device has a defined shape and size;
   a plurality of display retention components that are formed on a surface of the main frame in locations that correspond to locations of a plurality of holes in the housing of the display device, wherein the plurality of display retention components are configured to be slidable into the plurality of holes to retain the display device, without using screws, to mount the display device when the display device and the display retention bracket are inserted into a housing of a bezel; and
   an offset column component that comprises an offset column that is formed on a member of the main frame and extends upward from the main frame toward an adapter plate and away from the display device, wherein, in response to the adapter plate being fastened to the housing of the bezel to secure the display device and the display retention bracket within the bezel, a portion of the offset column is configured to be moveable in relation to the main frame to flexibly bend in response to a load being applied by the adapter plate to the offset column to thereby absorb a first portion of the load and to apply a second portion of the load to the display device to reduce an amount of the load that is transferred to the display device by the offset column from the adapter plate to facilitate offset of the load with respect to the display device.

2. The display retention bracket of claim 1, wherein the main frame is further configured to have a substantially rectangular shape and a size that enables the portion of the housing of the display device to be inserted into the space defined and surrounded by the main frame.

3. The display retention bracket of claim 1, wherein the plurality of display retention components are formed on an inner surface of the main frame in locations that correspond to locations of the plurality of holes formed in one or more sides of the housing of the display device, wherein the plurality of display retention components are configured to be slidable into the plurality of holes to retain the display device in the horizontal direction, and wherein the display retention bracket is configured to be vertically mounted into the housing of the bezel, to vertically mount the display device when the display device and the display retention bracket are inserted into the housing of a bezel, wherein the housing of the bezel does not support horizontal mounting.

4. The display retention bracket of claim 3, further comprising:
   an alignment component comprising a plurality of alignment pins that extend out in a vertical direction from the main frame, wherein respective locations of the plurality of alignment pins correspond to respective locations of holes in the housing of the bezel to align the display device in relation to the bezel when the display device and the display retention bracket are inserted into the housing of the bezel.

5. The display retention bracket of claim 4, wherein the alignment component facilitates retention of the display retention bracket in the vertical direction to vertically mount the display retention bracket in the housing of the bezel while the plurality of display retention components retain the display device in a horizontal direction to horizontally mount the display device.

6. The display retention bracket of claim 3, wherein a display retention component of the plurality of display retention components is structured to extend from the inner surface of the main frame towards a corresponding hole in the housing of the display device when the display retention bracket is attached to the display device.

7. The display retention bracket of claim 1, wherein the plurality of display retention components are formed on a surface of the main frame in locations that correspond to locations of the plurality of holes formed in a back side of the housing of the display, wherein the plurality of display retention components are configured to be slidable into the plurality of holes to retain the display in the vertical direction, to vertically mount the display when the display and the display retention bracket are inserted into the housing of a bezel.

8. The display retention bracket of claim 1, wherein the offset column component further comprises a plurality of offset columns that are formed on members of the main frame and extend vertically upward from the main frame toward the adapter plate and away from the display device, wherein the plurality of offset columns comprises the offset component, and wherein, in response to respective loads being applied to respective offset columns of the plurality of offset columns by the adapter plate, the respective offset columns apply a defined amount of clamping force to the display device to facilitate securing the display device within the bezel when the adapter plate is fastened to the housing of the bezel to secure the display device and the display retention bracket within the bezel, to control an amount of load applied to the display.

9. The display retention bracket of claim 1, wherein the portion of the offset column comprises an arm that comprises an arm portion that is not attached to the main frame to facilitate enabling the portion of the offset column to flexibly bend, in response to the load being applied by the adapter plate to the offset column, to facilitate absorbing the first portion of the load to reduce the amount of the load that is transferred to the display device.

10. The display retention bracket of claim 1, wherein at least the main frame is constructed of a material that is sufficiently flexible to enable the plurality of display retention components to be slid into the plurality of holes when the portion of the housing of the display device is inserted into the space defined and surrounded by the main frame.

11. The display retention bracket of claim 1, further comprising:
a cable retention component configured to extend outward from a cross member of the display retention bracket to a point that is in proximity to a back side of a cable connector when the cable connector is inserted into a cable receptacle located on a back side of the display device to retain the cable connector in the cable receptacle when the cable connector and associated cable wires are plugged into the cable receptacle and the display retention bracket is attached to the display device, wherein the back side of the cable connector is opposite to a front side of the cable connector that is inserted into the cable receptacle.

12. The display retention bracket of claim 11, wherein the cable retention component is further configured to retain the cable connector in the cable receptacle at least when a specified amount of pull-out force is applied to the cable connector, wherein the specified amount of pull-out force is based at least in part on a specified industrial standard.

13. The display retention bracket of claim 1, further comprising:
a cable guide component configured to have one or more channels formed on a cross member of the main frame, wherein the one or more channels are configured to have one or more cable wires inserted into the one or more channels to restrict movement of the one or more cable wires to secure the one or more cable wires.

14. The display retention bracket of claim 1, further comprising:
an orientation component comprising a plurality of non-symmetrical tabs formed on a member of the main frame to facilitate insertion of the display retention bracket and the display device into the housing of the bezel to enable the display device to have a specified orientation in relation to the bezel.

15. The display retention bracket of claim 1, further comprising:
a ground clip component comprising a ground clip attached to a member of the main frame and configured to be in contact with the bezel when the display retention bracket is inserted in the housing of the bezel and extend a ground path from the bezel to the display device to ground the display device in relation to the bezel.

* * * * *